US007543961B2

(12) United States Patent
Arik et al.

(10) Patent No.: US 7,543,961 B2
(45) Date of Patent: *Jun. 9, 2009

(54) LED LIGHT WITH ACTIVE COOLING

(75) Inventors: Mehmet Arik, Niskayuna, NY (US);
James T. Petroski, Parma, OH (US);
Stanton Weaver, Northville, NY (US)

(73) Assignee: Lumination LLC, Valley View, OH (US)

( * ) Notice: Subject to any disclaimer, the term of this patent is extended or adjusted under 35 U.S.C. 154(b) by 123 days.

This patent is subject to a terminal disclaimer.

(21) Appl. No.: 11/682,784

(22) Filed: Mar. 6, 2007

(65) Prior Publication Data

US 2007/0147046 A1   Jun. 28, 2007

Related U.S. Application Data

(63) Continuation-in-part of application No. 10/726,882, filed on Dec. 3, 2003, now Pat. No. 7,204,615.

(60) Provisional application No. 60/459,238, filed on Mar. 31, 2003.

(51) Int. Cl.
*F21V 29/00* (2006.01)

(52) U.S. Cl. .................. 362/294; 362/373; 362/800

(58) Field of Classification Search .............. 362/294, 362/373, 555, 800; 310/311, 322, 325, 328, 310/343, 346; 257/88, 706
See application file for complete search history.

(56) References Cited

U.S. PATENT DOCUMENTS

| 3,464,672 A | 9/1969 | Massa |
| 4,406,323 A | 9/1983 | Edelman |
| 4,490,649 A | 12/1984 | Wang |
| 4,498,851 A | 2/1985 | Kolm et al. |
| 4,501,319 A | 2/1985 | Edelman et al. |
| 4,503,358 A | 3/1985 | Kamei et al. |
| 4,590,399 A | 5/1986 | Roxlo et al. |
| 4,595,338 A | 6/1986 | Kolm et al. |
| 4,630,182 A | 12/1986 | Moroi et al. |
| 4,667,877 A | 5/1987 | Yao et al. |
| 4,763,225 A | 8/1988 | Frenkel et al. |
| 4,780,062 A | 10/1988 | Yamada et al. |
| 4,923,000 A | 5/1990 | Nelson |
| 4,941,398 A | 7/1990 | Morris et al. |

(Continued)

FOREIGN PATENT DOCUMENTS

EP   0 385 090 A1   9/1990

(Continued)

OTHER PUBLICATIONS

Jelena Vukasinovic and Ari Glezer, *Spot-Cooling by Confined, Impinging Synthetic Jet*, Proceedings of HT2003, ASME Summer Heat Transfer Conference, Jul. 21-23, 2003, Las Vegas, Nevada, USA.

(Continued)

*Primary Examiner*—Sandra L O'Shea
*Assistant Examiner*—Jason Moon Han
(74) *Attorney, Agent, or Firm*—Fay Sharpe LLP

(57) ABSTRACT

An LED light system that includes an LED and a synthetic jet actuator to cool the LED as disclosed.

34 Claims, 17 Drawing Sheets

U.S. PATENT DOCUMENTS

| | | | |
|---|---|---|---|
| 5,008,582 | A | 4/1991 | Tanuma et al. |
| 5,089,862 | A | 2/1992 | Warner, Jr. et al. |
| 5,130,912 | A | 7/1992 | Friederichs et al. |
| 5,136,489 | A | 8/1992 | Cheng et al. |
| 5,278,432 | A | 1/1994 | Ignatius et al. |
| 5,335,143 | A | 8/1994 | Maling et al. |
| 5,419,780 | A | 5/1995 | Suski |
| 5,522,712 | A | 6/1996 | Winn |
| 5,758,823 | A | 6/1998 | Glezer et al. |
| 5,785,418 | A | 7/1998 | Hochstein |
| 5,861,703 | A | 1/1999 | Losinski |
| 5,921,757 | A | 7/1999 | Tsutsul et al. |
| 6,008,126 | A | 12/1999 | Leedy |
| 6,020,257 | A | 2/2000 | Leedy |
| 6,045,240 | A | 4/2000 | Hochstein |
| 6,123,145 | A | 9/2000 | Glezer et al. |
| 6,252,726 | B1 | 6/2001 | Verdiell |
| 6,318,886 | B1 | 11/2001 | Stopa et al. |
| 6,333,852 | B1 | 12/2001 | Lin |
| 6,357,893 | B1 | 3/2002 | Belliveau |
| 6,440,212 | B1 | 8/2002 | Hayes |
| 6,451,175 | B1 | 9/2002 | Lal |
| 6,457,654 | B1 | 10/2002 | Glezer et al. |
| 6,481,874 | B2 | 11/2002 | Petroski |
| 6,511,209 | B1 | 1/2003 | Chiang |
| 6,517,221 | B1 | 2/2003 | Xie |
| 6,541,800 | B2 | 4/2003 | Barnett et al. |
| 6,554,607 | B1 | 4/2003 | Glezer et al. |
| 6,588,497 | B1 | 7/2003 | Glezer et al. |
| 6,770,960 | B2 | 8/2004 | Oohata |
| 6,815,724 | B2 | 11/2004 | Dry |
| 2001/0030866 | A1 | 10/2001 | Hochstein |
| 2002/0167637 | A1 | 11/2002 | Burke et al. |
| 2003/0075615 | A1 | 4/2003 | Saddoughi |
| 2003/0177899 | A1 | 9/2003 | Monson et al. |
| 2004/0120148 | A1 | 6/2004 | Morris et al. |
| 2004/0190305 | A1 | 9/2004 | Arik et al. |
| 2006/0191707 | A1 | 8/2006 | Ishikawa et al. |

FOREIGN PATENT DOCUMENTS

| | | |
|---|---|---|
| JP | 62072149 | 4/1987 |

OTHER PUBLICATIONS

Emil Venere, *Engineers create tiny, wiggling fans to cool future electronics*, Purdue News at http://news.uns.purdue.edu/UNS/html4ever/011213.Garimella.fans.html.

Sudipta Basak, Arvind Raman and Suresh V. Garimella; *Dynamic Response Optimization of Asymmetrically Configured Piezoelectric Fans*; Proceedings of DETC'03, ASME 2003 Design Engineering Technical Conferences and Computers and Information in Engineering Conference, Sep. 2-6, 2003, Chicago, Illinois, USA.

Tolga Açikalin, Brian D. Iverson, Suresh V. Garimella and Arvind Rama, *Numerical Investigation of the Flow and Heat Transfer Due to a Miniature Piezoelectric Fan*, Proceedings of IMECE04, 2004 ASME International Mechanical Engineering Congress and Exposition, Nov. 13-20, 2004, Anaheim, California, USA.

Tolga Açikalin, Suresh V. Garimella, James Petroski, and Arvind Rama; *Optimal Design of Miniature Piezoelectric Fans for Cooling Light Emitting Diodes*; 2004 Inter Society Conference on Thermal Phenomena; pp. 663-671.

Philipp Bürmann, Arvind Rama and Suresh V. Garimella; *Dynamics and Topology Optimization of Piezoelectric Fans*; IEEE Transactions on Components and Packaging Technologies, vol. 25, No. 4, Dec. 2003.

International Search Report PCT/US2008/054314 dated Jul. 14, 2008.

Written Opinion of the International Searching Authority (Form PCT/ISA/237) PCT/US2008/054314 dated Jul. 14, 2008.

LED LIGHT WITH ACTIVE COOLING

This application is related to U.S. patent application Ser. No. 11/676,812 which is a continuation-in-part of U.S. patent application Ser. No. 10/726,882, which claims priority to U.S. provisional patent application Ser. No. 60/459,238 filed Mar. 31, 2003. All of the aforementioned patent applications are incorporated by reference herein.

BACKGROUND

An LED (light emitting diode) generally includes a diode mounted onto a die or chip. The diode is then surrounded by an encapsulant. The die receives electrical power from a power source and supplies power to the diode. The die can be mounted in a die support. To produce a brighter LED, generally, more power is delivered to the LED.

Many LED lighting systems dissipate heat through a different heat transfer path than ordinary filament bulb systems. More specifically, high power LED lighting systems dissipate a substantial amount of heat via terminals or through the die attached in a direct die mount device. The conventional heat dissipation systems (i.e. radiating a large percentage of heat to a front lens of a lamp) do not adequately reduce heat in higher power LED systems. Consequently, high power LED systems tend to run at high operating temperatures.

High operating temperatures degrade the performance of the LED lighting systems. Empirical data has shown that LED lighting systems may have lifetimes approaching 50,000 hours while at room temperature; however, operation at close to 90° C. may reduce an LED life to less than 7,000 hours.

BRIEF SUMMARY OF THE INVENTION

A lamp system can include an enclosure, an LED disposed in the enclosure, a synthetic jet actuator at least partially disposed in the enclosure, and power conditioning circuitry in electrical communication with the LED and the synthetic jet actuator. The synthetic jet actuator generates a current of fluid to cool the LED. The power conditioning circuitry receives source power from a source and delivers a first power to the synthetic jet actuator and a second power to the LED.

In another embodiment, a lamp includes an enclosure, an electrical connector attached to the enclosure, an LED disposed in the enclosure and in electrical communication with the electrical connector, and a synthetic jet actuator in electrical communication with the electrical connector. A connector is configured to electrically connect to an external power source. The synthetic jet actuator is arranged in the enclosure to generate a fluid current to cool the LED.

In another embodiment, an LED light assembly includes an LED and a synthetic jet actuator disposed with respect to the LED for creating a fluid current to cool the LED. The synthetic jet actuator includes a first plate, a second plate, a piezoelectric material contacting at least one of the first plate and the second plate and a flexible hinge connecting the first plate and the second plate.

BRIEF DESCRIPTION OF THE DRAWINGS

The drawings are only for purposes of illustrating embodiments of the invention and are not to be construed as limiting the invention, which is defined by the appended claims.

DETAILED DESCRIPTION OF THE INVENTION

Figure 1:
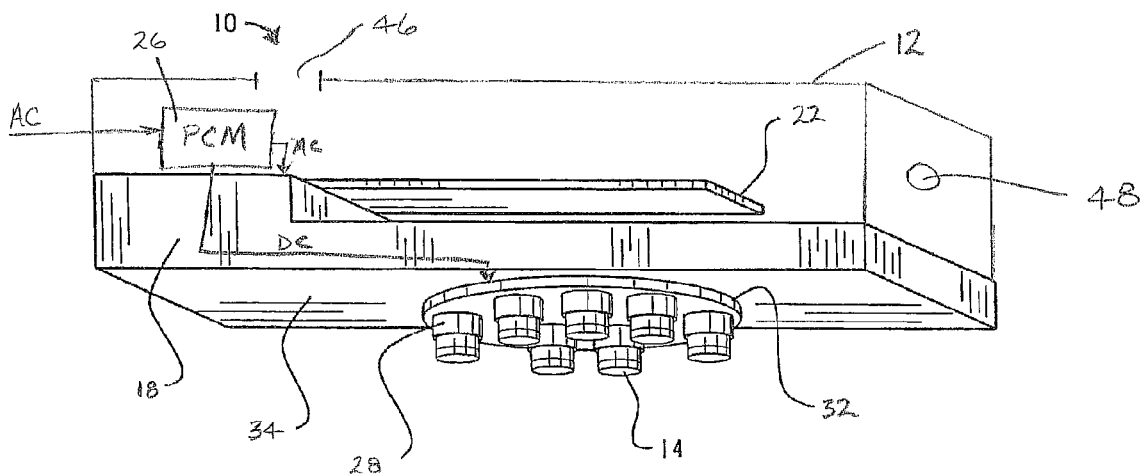
FIG. 1 illustrates a side perspective view, where portions are schematically depicted, of an LED lamp having a heat dissipation system.
Figure 3:
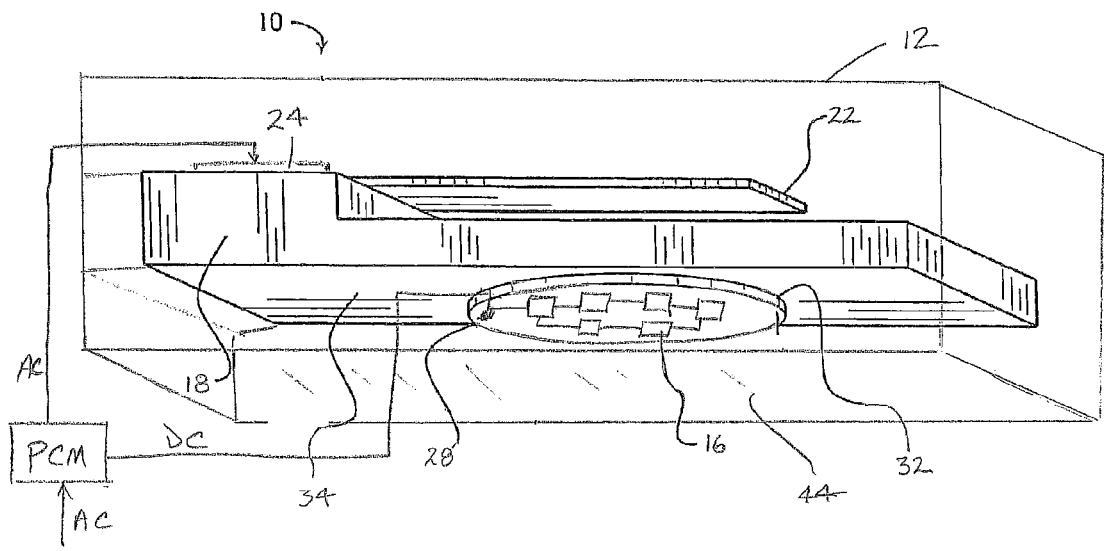
FIG. 3 illustrates a side perspective view, where portions are schematically depicted, of an alternative example of an LED lamp having a heat dissipation system.

With reference to FIG. 1, an LED lamp 10 generally includes a housing (or frame) 12, a plurality of LEDs, which in FIG. 1 are provided in LED devices 14 and in FIG. 3 are shown as chip-on-board devices 16, that are in communication with a heat sink 18. A flexible blade 22 oscillates to generate a fluid current to cool the LEDs and, perhaps, other electrical components.

The flexible blade 22 is driven, i.e. caused to oscillate, by an electronic actuator. One example of an electronic actuator is piezoelectric material 24 that connects to the blade and receives power from a power control module 26 to move the blade to generate a fluid stream that passes over surfaces of the heat sink to cool the LEDs. With reference to FIG. 2A, another example of an electronic actuator can include a coil 82 disposed about a core 84 (depicted schematically) constructed of magnetic material. The embodiment depicted in FIG. 2A, other than not including piezoelectric material, is the same as the embodiments depicted in FIGS. 1-3, and therefore the same reference numbers have been used. In this example a magnet 86 affixes to a free end of the blade 22 and the power control module (not depicted in FIG. 2A, but the same or similar to the power control modules depicted in FIGS. 1 and 3) delivers AC current to the coil to provide a magnetic force to move the blade from side to side.

With reference to the example depicted in FIG. 1, each LED device 14 includes a die or multiple die (not visible) that are received in a die support 28. Heat that is generated by the LED device 14 is transferred to the heat sink 18 via the die. The LED device 14 mounts to a support 32 that attaches to the heat sink 18. The support 32 can include a printed circuit board ("PCB") such as metal core printed circuit board ("MCPCB"), an FR4 PCB having thermal vias, a flexible circuit, as well as other types of supports upon which LED devices can be mounted. With reference to the example depicted in FIG. 3, each LED 16 mounts directly to the support 32 in a chip-on-board configuration. Heat is transferred into the heat sink 18 through conduction.

The mounting of the LED and the electrical connections on the support 32 used to supply power to the LED are known in the art, and therefore need no further description is provided. The LEDs and LED devices can be conventional that are known in the art. In the examples depicted in FIGS. 1-3, the support 32 is mounted to a first surface or under surface 34 of the heat sink.

Figure 2:
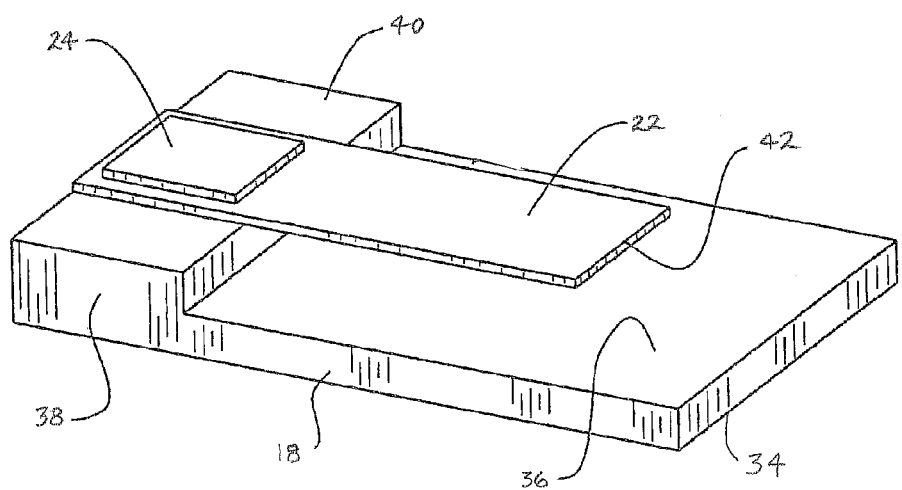
FIG. 2 illustrates a top perspective view of the heat dissipation system of the LED lamp device of FIG. 1.
Figure 2A:
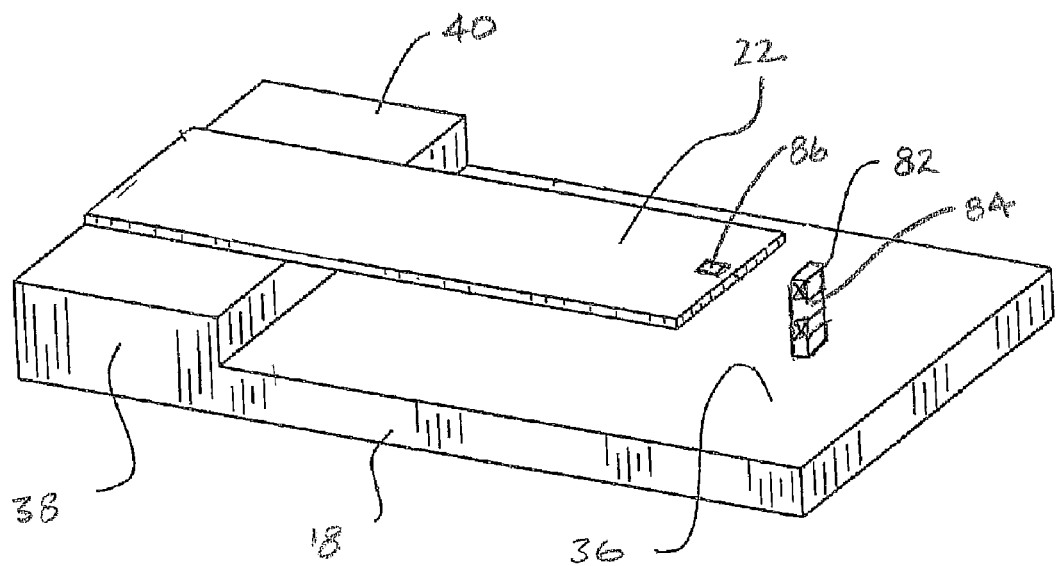
FIG. 2A illustrates a top perspective view of an alternative embodiment of a heat dissipation system of the LED lamp device.

With reference also now to FIG. 2, the heat sink 18 includes the under surface 34 and a second or upper surface 36, which acts as a fluid flow path surface for dissipating the heat generated by the LEDs. The heat sink can be made from a material having a high coefficient of thermal conductivity, e.g. aluminum and/or copper. Preferably, the heat sink 18 includes a material having a coefficient of thermal conductivity greater than about 50 W/m K. The heat sink is also preferably made from a lightweight thermally conductive material such as a graphite composite, aluminum, a thermally conductive plastic, and the like. The upper surface provides a heat dissipating surface over which a fluid, most likely air, will flow to facilitate heat dissipation. The heat sink 18 can be a separate thermally conductive component of the lamp 10 (see FIG. 3), or it can be an integral thermally conductive component with one of the components of the lamp, for example the housing 10, which can also include materials having a coefficient of thermal conductivity greater than about 20 W/m K (for example steel or thermally conductive plastic materials). The heat sink can also include the structure to which the LED mounts, including the PCB or similar structure.

In the embodiment depicted in FIGS. 1-3, a pedestal 38 extends upwardly from and normal to the upper surface 36 of the heat sink 18. As shown, the pedestal 38 is the same width as the heat sink 18; however, the pedestal need not be the same width as the heat sink. The pedestal 38 has a pedestal surface 40 on which the blade 22 is mounted, The pedestal surface 40 is spaced from the upper surface 36 an adequate amount to allow the blade 22 to flap or oscillate. Accordingly, the length and characteristics of the blade can limit the difference in elevation between the pedestal surface 40 and the upper surface 36, and vice versa. The pedestal 38 can be solid, in that it does not contain any passages through which fluid can flow between the upper surface 36 and the blade 22, at the point of attachment between the fan and the pedestal. Similarly, the pedestal 38 can also be hollow and the walls that depend from the upper surface 36 can prevent fluid flow at the point of attachment between the fan and the pedestal. In FIGS. 1 and 2, the pedestal 38 is located at an end of the heat sink 18. Alternatively, the pedestal 32 can be more centrally located on the heat sink 18. In this alternative, a blade or a plurality of blades can cantilever off each side of the pedestal 38 and, thus, over the upper surface 36. The blade 22 is shown mounted to a central portion of the pedestal 38; however, the blade can mount elsewhere on the pedestal.

As stated earlier, the heat generated by the LEDs is transferred through thermal conduction to the heat sink 18. To cool the heat sink, air or some other fluid, is moved over and around the surfaces of the heat dissipating structure. The blade 22 facilitates the movement of such fluid over the heat sink.

The blade 22 and the piezoelectric material 24 make up a device that is commonly referred to as a piezoelectric fan. The blade is arranged in the housing 12 so that it does not obstruct light emanating from the LEDs. The blade is made of a flexible material, preferably a flexible metal. An unattached (free) end 42 of the blade 34 cantilevers away from the pedestal 38 and over the upper surface 36. The blade mounts to the pedestal surface 40 such that the unattached end 42 of the blade 22 does not contact the upper surface 36 when the blade is moving. In FIGS. 1 and 2, the blade is mounted directly to the heat sink. Alternatively, the blade can mount to another component of the lamp. In this alternative, the blade mounts to a portion of the lamp near the heat sink so that the blade can generate an airflow around the exterior surfaces of the heat sink. Furthermore, the blade in FIGS. 1 and 2 is mounted such that it moves up and down; however, a blade can mount such that it moves side to side, or in another axis, for example diagonally.

The piezoelectric material 24 attaches to the blade 22 opposite the unattached end 42 and over the pedestal 38. Alternatively, the piezoelectric material 24 can run the length, or a portion of the length, of the blade 22. The piezoelectric material 24 comprises a ceramic material that is electrically connected to a power control module 26 in a conventional manner.

As electricity is applied to the piezoelectric material 24 in a first direction, the piezoelectric material expands, causing the blade 22 to move in one direction. Electricity is then applied in the alternate direction, causing the piezoelectric material 24 to contract and moving the blade 22 back in the opposite direction. The alternating current causes the blade to move back and forth continuously.

The power control module 26 in the depicted embodiment is configured to receive AC power from a source and to deliver DC power to the LEDs and to deliver AC power to the piezoelectric material. If desired, AC power can be delivered to the LEDs, but care should be taken to minimize the reverse biasing of the LEDs. The power control module 26 can include circuitry and power conditioning components, e.g. a rectifier and a voltage regulator, to condition the source power that is received. The power control module can convert higher voltage AC power to lower voltage DC power to drive the LEDs. The power control module can also remove any spikes or surges from the AC source power and deliver a cleaner AC power to the piezoelectric material. The power control module 26 can be arranged in the housing 12 of the lamp 10 (see FIG. 1) or it can be remote from the housing 12 (see FIG. 3) and electrically connected to the piezoelectric material 24 and the LEDs.

The lamp 10 can include a translucent cover or lens 44 (shown only in FIG. 3) that attaches to the housing 12 and covers the LEDs. The housing 12 can also be generally closed having a fluid inlet 46 (depicted schematically in FIG. 1) and a fluid outlet 48. Cool air is drawn in through the inlet 46 and hot air is expelled through the outlet 48. The inlet 46 and the outlet 48 may be covered with filters, respectively, to inhibit the intrusion of dust into the housing.

During operation of the lamp 10, each LED generates heat. The heat from the LED conducts into the heat sink 18. Meanwhile, an alternating current is supplied to the piezoelectric material 24 causing the blade 22 to move oscillate, which results in a fluid current moving around the heat sink. The flow of fluid around the heat sink cools the heat sink more quickly as compared to having no moving fluid. Accordingly, more heat can be dissipated from the LEDs resulting in a lower operating temperature. Furthermore, the footprint of the lamp can be reduced because the size of the heat sink can be reduced due to the active cooling caused by the moving blade. Also, a quiet active cooling takes place because the piezoelectric fan does not generate a lot of noise, which would be unattractive to consumers.

Figure 4:
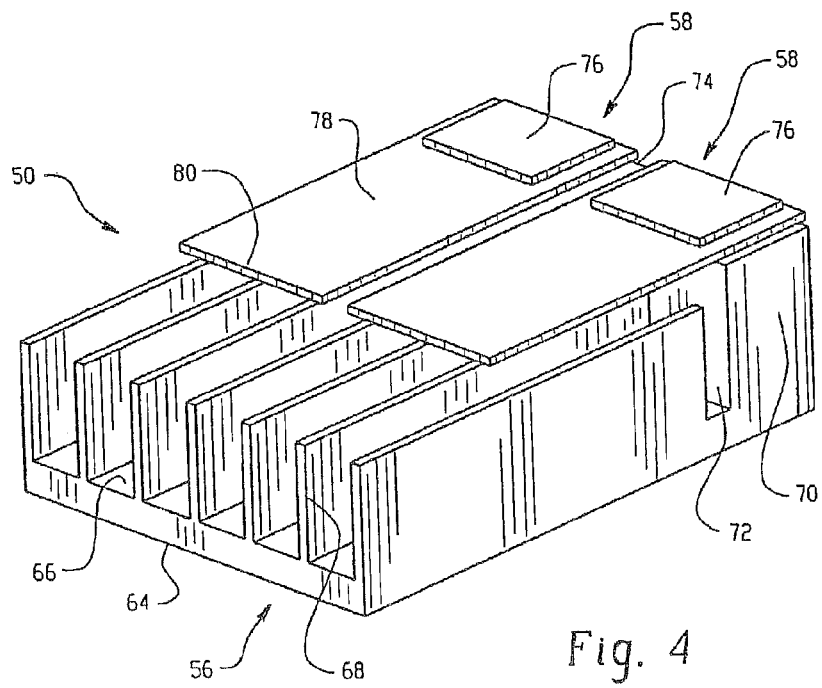
FIG. 4 illustrates a top perspective view of an alternative example of a heat dissipation system for the LED lamp device of FIG. 1 or FIG. 3.

With reference now to FIG. 4, a heat dissipating system 50 of an LED lamp is disclosed. The LED lamp includes an LED array (not visible but made up of LED devices 14 shown in FIG. 1 or LEDs 16 shown in FIG. 3). A pair of fans 58 mounts to the heat dissipating structure (heat sink) 56. Alternatively, only one fan can mount to the heat dissipating structure or a plurality of fans can mount to the heat dissipating structure. Heat generated by LEDs is transferred to the heat dissipating structure 56 through a die (not visible).

The heat dissipating structure 56 includes a first or lower surface 64 to which the LED array is mounted. The heat dissipating structure 56 also includes a second or upper surface 66 opposite the lower surface 64. Fins 68 project upwardly and substantially normal to the plane of the upper surface 66. The upper surface 66 and the surface area of the fins 68 provide a flow path surface over which a fluid, most likely air, will flow to facilitate heat dissipation. The fins 68 increase the surface area of flow path surface.

The heat dissipating structure 56 also includes a pedestal 70 projecting upwardly from the upper surface 66 of the heat dissipating structure 56. The pedestal 70 also projects upwardly substantially normal to the plane of the upper surface 66 away from the lower surface 64. The pedestal 70 is similar to the pedestal 30 described with reference to FIGS. 1-3. The pedestal 70 is spaced from the fins 68 such that a gap 72 is defined between an end of each of the fins and the pedestal. The pedestal 70 includes a pedestal surface 74 that is elevated above the fins 68.

The piezoelectric fans 58 are mounted on the pedestal surface 74. Each fan 58 includes piezoelectric material 76 and a blade 78. Each piezoelectric fan 58 is similar to the piezoelectric fans described above with reference to FIGS. 1 and 2. An unattached end 80 of each blade 78 cantilevers away from the pedestal 70 and over the fins 68. Each blade 58 is spaced from the each of the fins 68 so that when each blade 78 moves up and down the unattached end 80 does not contact the fins. Also, the pedestal 70 can extend upwardly where the fans 58 are disposed between the fins 68, as opposed to over the fins. Similar to the piezoelectric fan shown in FIGS. 1 and 2, each fan 58 has the piezoelectric material 76 attached to the blade 78 opposite the unattached end 80 and over the pedestal 70.

Figure 5:
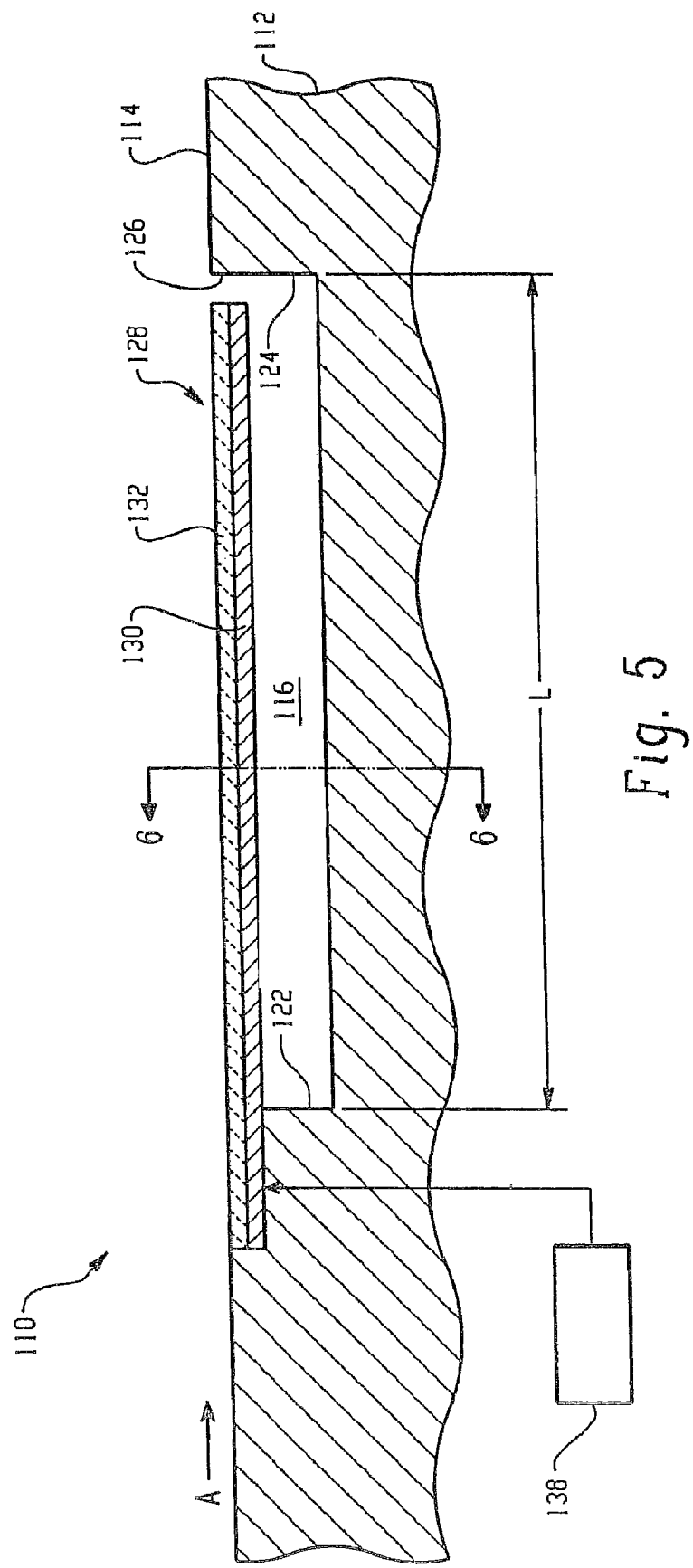
FIG. 5 illustrates a schematic sectional side view of an alternative heat dissipation system for an LED lamp.

With reference to FIG. 5, a current generator 110 is disposed in a wall 112. The current generator creates a substantially vortex-shaped current; however, the current generator is not limited to creating a substantially vortex-shaped current, but should be construed to include any device that can create a fluid current of any configuration. The wall 112 can form a portion of the heat dissipating structure (heat sink) of an LED lamp described with reference to FIGS. 1-4. The wall 112 can also include the structure to which an LED is mounted, such as a printed circuit board. The wall includes a flow path surface 114 over which fluid circulates to cool the wall.

A generally rectangular cavity 116 having a depth D (FIG. 6), width W (FIG. 6), and length L is formed in the wall 112. The cavity 116 has a pair of spaced-apart generally parallel side walls 118 and 120 (FIG. 6) and a pair of spaced-apart generally parallel end walls 122 and 124. The walls define an opening 126 in the flow path surface 114. The opening 126 of the cavity 116 is covered by a flexible, generally rectangular actuator blade 128.

Figure 6:
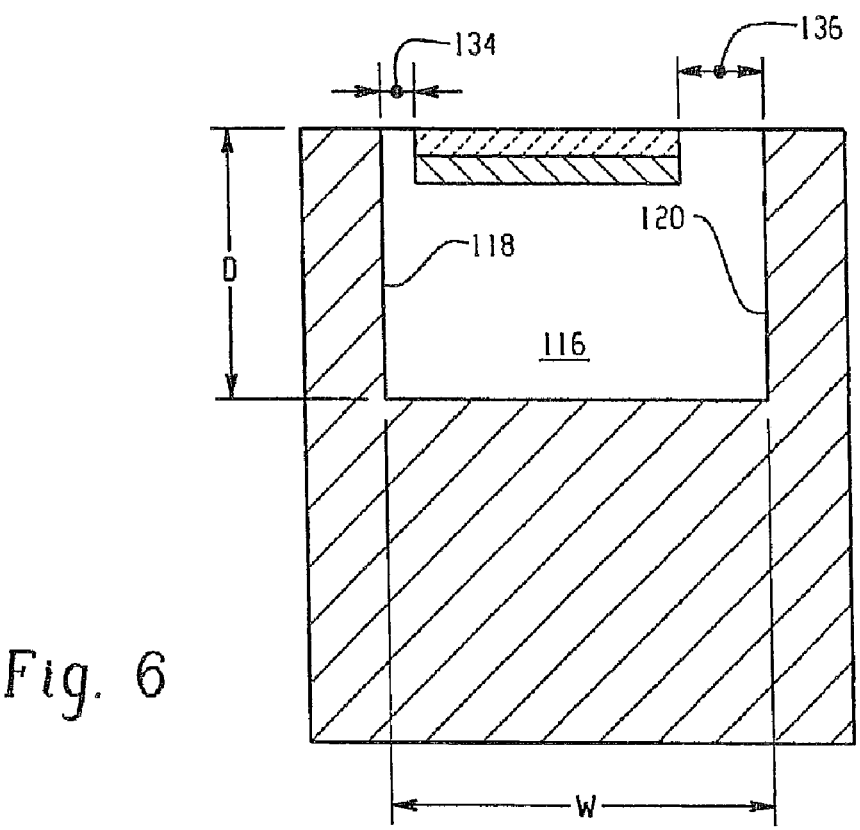
FIG. 6 illustrates a cross-sectional view taken along lines 6-6 of FIG. 5.

The blade 128 is attached to the wall 112 by a cantilever support at first end of the cavity 116. Alternatively the blade 128 could also attach to the wall 112 an opposite end of the cavity 116. The blade 128 can attach to the wall 112 in any conventional manner, for example with an adhesive or fasteners. The blade 128 includes two layers: a flexible layer 130 formed from a flexible material, such as stainless steel or aluminum, and a piezoelectric layer 132 attached to the flexible layer 130 and formed from a piezoelectric material, for example piezoceramic. The piezoelectric layer 132 is disposed closest to the flow path surface 114; however, the piezoelectric layer 132 can be disposed opposite the flow path surface. Although the illustrated example shows a single piezoelectric layer 132, a second layer piezoelectric layer can attach to the opposite side of the blade 128, so that the flexible layer 130 would have a piezoelectric layer on each side. The layers 130 and 132 are securely bonded to each other, for example by the use of an adhesive layer. Also the layers 130 and 132 are substantially the same length. As seen in FIG. 6, the width of the blade 128 is less than the width W of the cavity 116. As seen in FIG. 5, the length of the portion of the blade 128 extending over the cavity 116 is slightly less than the length L of the cavity 116 to provide an operating clearance. The length L of the cavity 116 (and thus the length of the blade 128) can be varied, although the shorter the blade and/or cavity become, the smaller the tip deflection of the blade 128 and thus the lower the effectiveness of the current generator 110.

In one embodiment the length L of the cavity can be about 10 inches. This is significantly larger than known similar devices. The blade 128 is installed in an off-center position relative to the cavity 116 such that two unequal side gaps 134 and 136 are created between the edges of the blade 128 and the side walls 118 and 120 of the cavity 116. The blade 128 is also connected to a controllable electric source 138 (depicted schematically in FIG. 5) to supply an alternating voltage of the desired magnitude and frequency to the blade 128. The controllable electric source 138 can also supply direct current voltage to the LEDs that are in thermal communication with the wall 112.

In operation, an alternating voltage is applied to the blade 128 from the controllable source. When a potential is applied across the piezoelectric layer 132, the layer 132 either expands or contracts depending upon the polarity of the voltage. Since the piezoelectric layer 132 is bonded to the flexible layer 130, the application of the alternating voltage induces a bending strain resulting in oscillation of the blade 128.

In one example, a blade 128 approximately 25.4 cm (10 in.) long, 25.4 mm (1 in.) wide, and 3.43 mm (0.135 in.) thick, having a flexible layer 130 of stainless steel 3.18 mm (0.125 in.) thick was constructed. When a 75 Hz, 200V RMS sinusoidal input signal was applied, the peak-to-peak tip deflection at the unattached end of the blade 128 was approximately 1.27 mm (0.5 in.). This tip deflection is somewhat greater than prior art devices and increases the capacity of the current generator 110. Furthermore, the use of a piezoceramic actuator has advantages over other known types of actuators, such as mechanical actuators, particularly in that it may be reliably operated at higher frequencies, for example about 70-80 Hz, which further increases the effectiveness of the current generator 110. A mechanically actuated device has problems operating at these frequencies because it tends to distort the blade into a sinusoidal mode shape, which interferes with the creation of the desired vortex patterns. The piezoelectrically actuated blade 128 of this example does not experience this problem.

Figure 7:
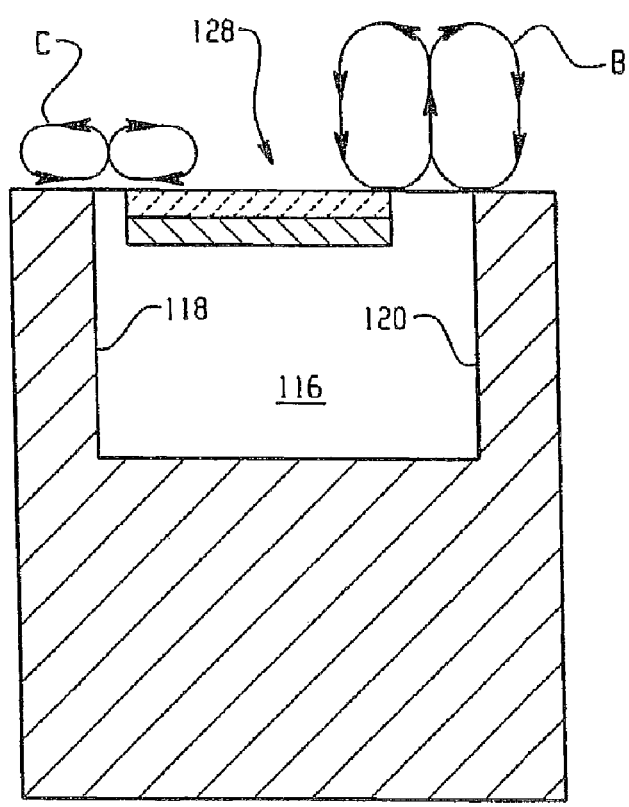
FIG. 7 illustrates a cross-sectional view similar to that of FIG. 6.

In operation, as the blade 128 moves outward with respect to the cavity 116, increasing the cavity volume, ambient fluid is drawn from large distances from the large side gap 136 into the cavity 116. On the subsequent down stroke, the blade 128 moves downward into the cavity 116, decreasing the cavity volume and expelling fluid from the cavity through the large side gap 136. As shown in FIG. 7, this alternating "pull" and "push" of the blade 128 results in a vortex flow pattern above the large side gap 136, illustrated by arrow B. A similar flow pattern, to a lesser degree, is created above the narrow side gap 134, illustrated by arrow C. The larger side gap 136 forms the primary passage for fluid into and out of the cavity 116, while the narrow side gap 134 primarily creates a space for operating clearance of the blade 128 as it oscillates. In the case where the flow over the surface of the wall 112 is opposite to the direction of arrow A, there is an additional benefit in that when the current generator blade is extended outward, it acts as a conventional vortex generator protruding from the surface, helping to prevent flow separation. Also the end wall 124 prevents axial current flow below the flow path surface 114.

Figure 8:
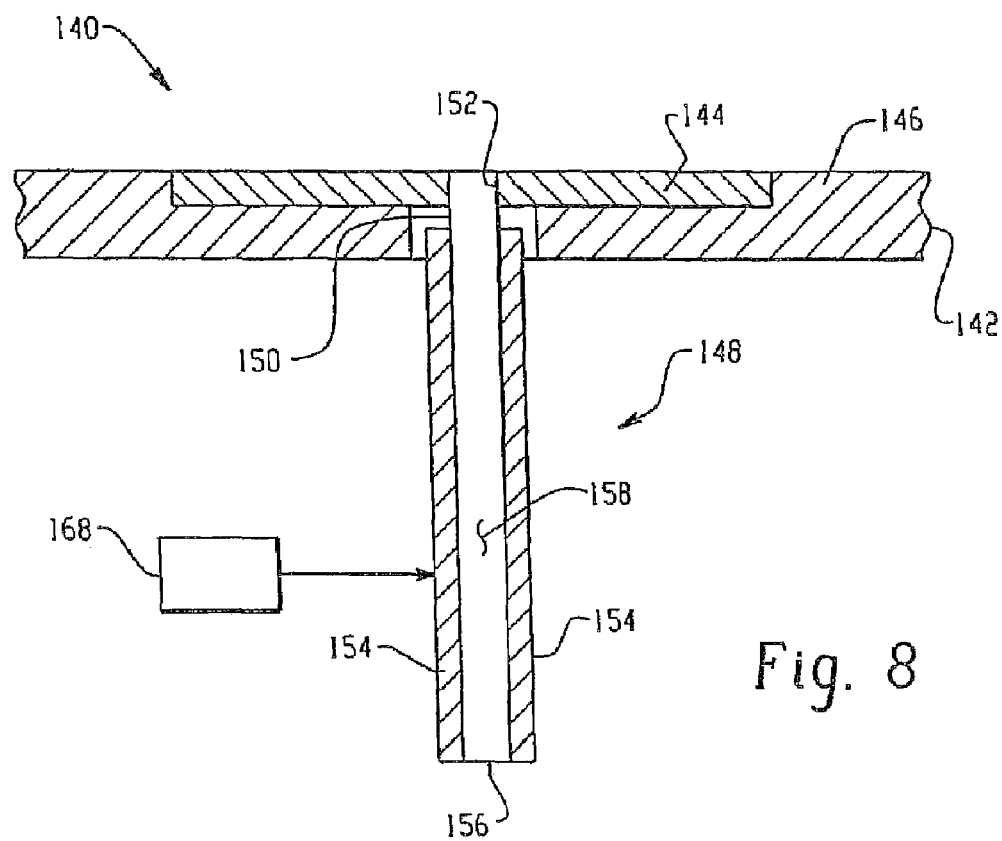
FIG. 8 illustrates a schematic sectional side view of an alternative heat dissipation system for an LED lamp device.

Referring to FIG. 8, a synthetic jet actuator 140 is disposed in a wall 142. The synthetic jet also generates a current similar to the fan and the current generator described above. A current generator body 148 is attached to an orifice plate 144 by a discharge conduit 150, which is an extension of a flexible hinge 156, described below. The orifice plate 144 is disposed in the wall 142 flush with a flow path surface 146. The interior of the current generator body communicates with the flow path surface 146 of the wall 142 through one or more orifices 152 in the orifice plate 144.

The current generator body 148 is constructed from a pair of side plates 154 that are connected by the flexible hinge 156. The plates 154 are spaced apart from each other and are disposed in a generally parallel relationship. The flexible hinge 156 surrounds the periphery of each plate 154 and can overlap the edges of the plates 154. The hinge 156 holds the side plates 154 together. An internal fluid cavity 158 is thus enclosed by the side plates 154 and the hinge 156. Each side plate 154 can be a circular disk or other shapes, for example rectangular. This arrangement is similar to a bellows. The hinge 156 can be constructed from any flexible, fluid-tight material. The hinge can also be made of a material that is suitable as an adhesive, for example a room temperature vulcanizing (RTV) material, an elastomer, or other flexible material.

Figure 12:
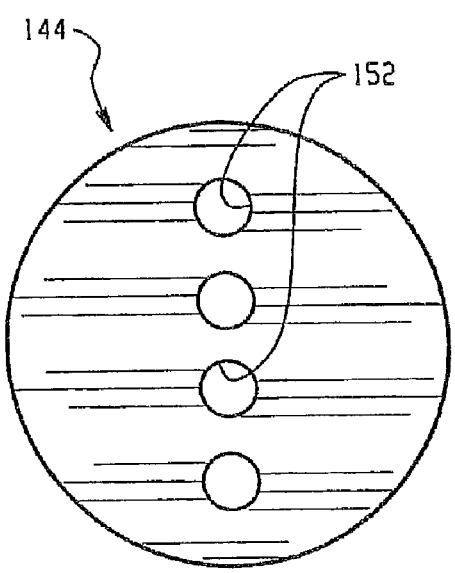
FIG. 12 illustrates a top plan view of an orifice plate.
Figure 13:
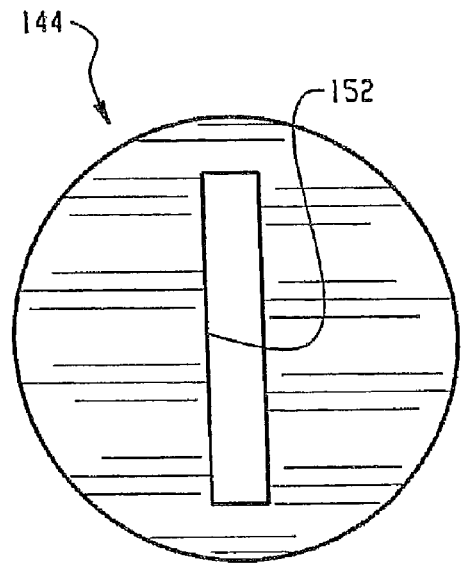
FIG. 13 illustrates a top plan view of an alternative orifice plate.

The orifices 152 may be a series of holes as shown in FIG. 12, or may take the form of an elongated slot, as shown in FIG. 13. The size, shape, number and angle of the orifices 152 can be modified in order to suit a particular application, for example the orifices 152 can be angled in a downstream direction (pitch angle), or the array of orifices 152 can be angled in the plane of the orifice plate 144 (yaw angle).

Figure 9:
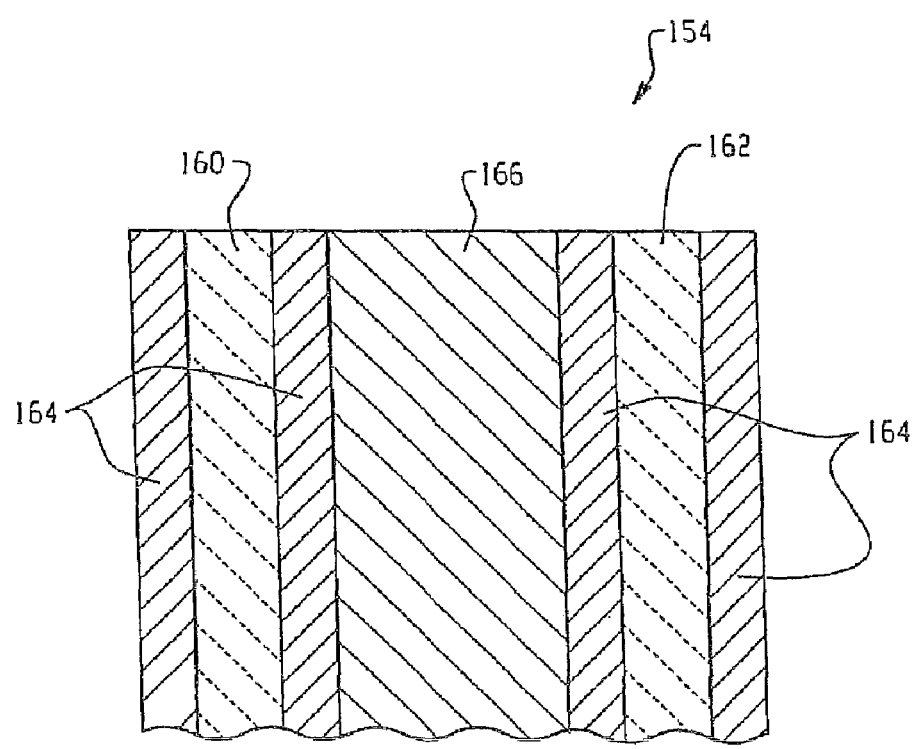
FIG. 9 illustrates a detailed view of one of the side plates of FIG. 8.

Referring to FIG. 9, each side plate is formed from a plurality generally planar stacked layers. Each side plate 154 forms a bimorph piezoelectric structure; each side plate comprises two piezoelectric layers 160 and 162 having opposite polarities. The piezoelectric layers 160 and 162 are made of a piezoceramic material. When a voltage is applied to the bimorph piezoelectric structure, one layer 160 expands while the other layer 162 contracts due to the opposite-facing polarities. Since the piezoelectric layers 160 and 162 are parallel to each other, the application of a voltage causes the side plate 154 to take up a roughly hemispherical shape, in the case of circular side plates. When a voltage of opposite polarity is applied, the side plate 154 bends in the opposite direction (i.e. concave instead of convex). This arrangement in effect doubles the force exerted for a given voltage compared to a single piezoelectric layer.

The piezoelectric layers 160 and 162 are covered on each side with a thin protective cladding layer 164 to prevent cracking of the piezoelectric layers 160 and 162. In an exemplary embodiment the cladding layers 164 are made of stainless steel, preferably very thin, and are attached to the piezoelectric layers 160 and 162 with a suitable adhesive. The piezoelectric layers 160 and 162 with the attached cladding layers are attached to opposite sides of a central layer referred to as a shim 166, for example with an adhesive layer. The shim 166 material and thickness is selected for sufficient stiffness to place the operating frequency of the actuator body 148 in the desired range. In the illustrated example, the shim 166 is made of aluminum. The side plates 154 are connected to a controllable electric source 168 (shown schematically in FIG. 4) so that an alternating voltage of the desired magnitude and frequency may be applied to the blade side plates 154.

In operation, voltage from the electric source is applied to the side plates 154 so as to cause the plates to deflect in opposite directions to each other. That is, when the left-hand side plate 154 illustrated in FIG. 9 is deflected convexly to the right, the right-hand side plate 154 is deflected convexly to the left. This simultaneous deflection reduces the volume of the fluid cavity 158 and causes fluid to be expelled through the discharge conduit 150 and then from the orifice 152. When voltage of opposite polarity is applied, the side plates deflect in the opposite direction. This action increases the volume of the fluid cavity 158 and causes a decreased partial pressure in the fluid cavity 158, which in turn causes fluid to enter the fluid cavity 158 through the orifice 152. Since each side plate 154 is a bimorph piezoelectric structure, and there are two side plates, this embodiment of the present invention has four times the capacity of a single piezoelectric device of the same overall dimensions. Fluid can expelled from the orifice 152 in a multitude of directions by simply changing the orientation and/or configuration of the plates, the flexible hinge or the orifice. Furthermore, the synthetic jet actuator 140 can be used to directly cool an LED die that does not include a heat sink or a larger heat dissipating structure.

Figure 9A:
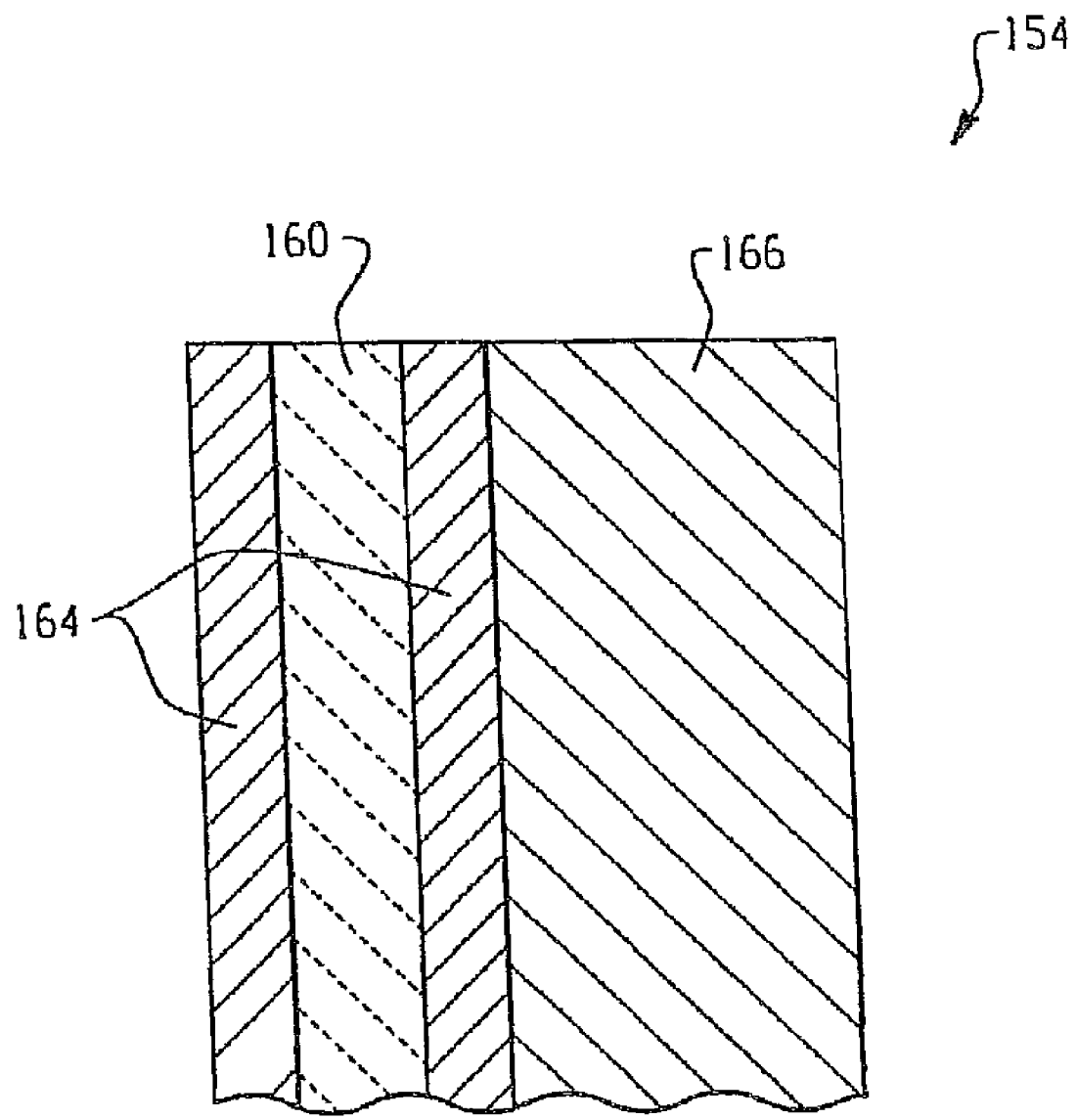
FIG. 9A illustrates a detailed view of an alternative embodiment of one of the side plates of FIG. 8.

With reference to FIG. 9A, alternatively the each side plate 154 can have a unimorph construction in that each side plate has a single piezoelectric material 160 that is located on an external surface of the side plate. The remainder of the construction is similar to the construction of the synthetic jet described above in that it can include the shim 166 and the protective layer(s) 164.

Figure 10:
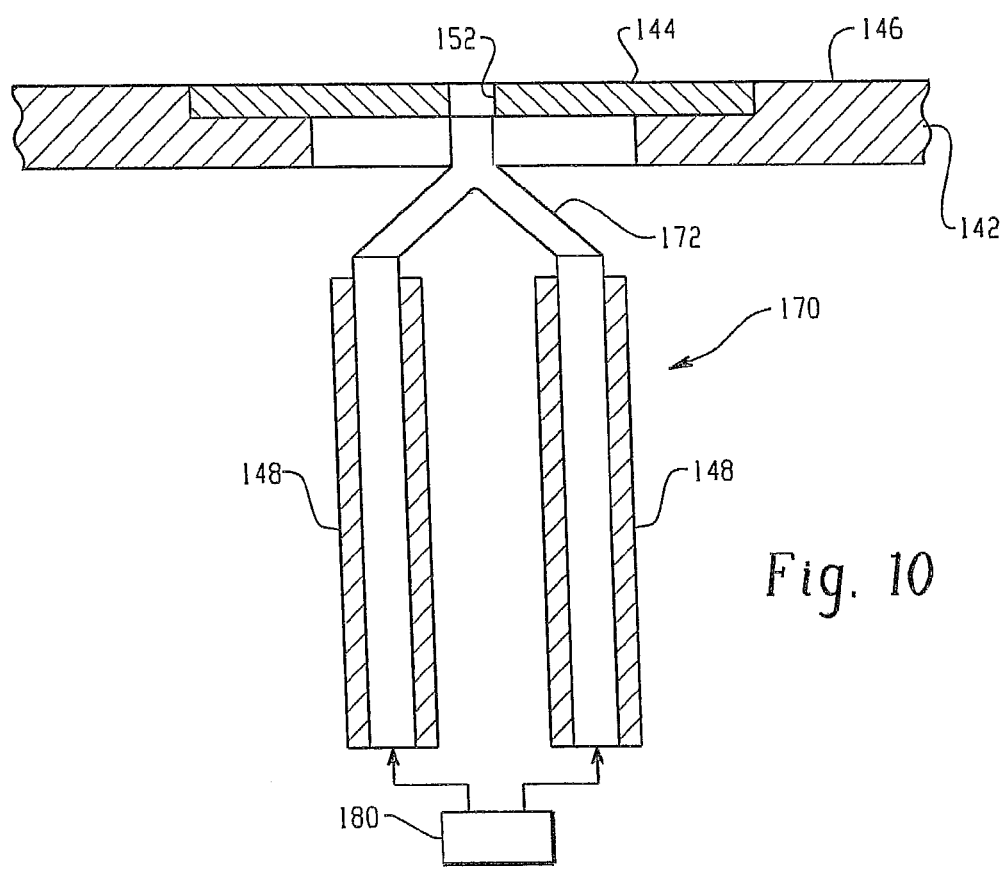
FIG. 10 illustrates a schematic sectional side view of an alternative heat dissipation system for an LED lamp device.
Figure 11:
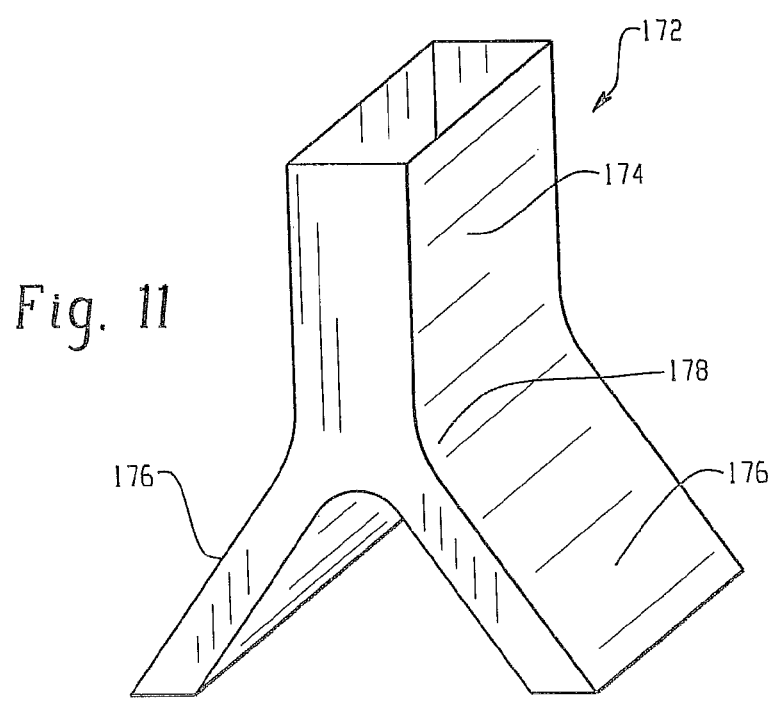
FIG. 11 illustrates a perspective view of a discharge conduit.

The output of two or more of the current generator bodies 148 can be combined into a single discharge area. As seen in FIG. 10, a synthetic jet actuator 170 comprises, for example, a pair of current generator bodies 148 disposed adjacent a wall 142. A discharge conduit 172 having a generally inverted Y-shape connects the two current generator bodies 148. The conduit 172 is shown in more detail in FIG. 11. The conduit 172 is hollow and has an outlet leg 174 connected to two inlet legs 176 at a junction 178. The outlet leg 174 of the conduit 172 communicates with the flow path surface 146 of the wall 142 through one or more orifices 152 in the orifice plate 144. The orifices 152 may be a series of holes, as shown in FIG. 12, or may take the form of an elongated slot as shown in FIG. 13. The size, shape, number and angle of the orifices 152 may be modified in order to suit a particular application. The orifices 152 may also be arranged in the pattern illustrated in FIGS. 14 and 15, as described in more detail below. With reference back to FIG. 10, the current generator bodies 148 are connected to a controllable electric source 180 (shown schematically). It should be noted that it is possible to use one power source 180 for multiple current generator bodies 148 connected in series, because each current generator body 148 has a low power consumption. This variation of the invention provides further increased capacity from a single orifice plate.

Figure 14:
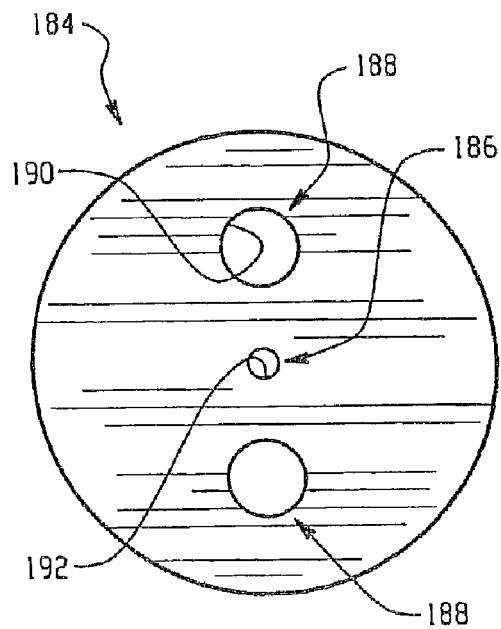
FIG. 14 illustrates a top plan view of an alternative orifice plate.
Figure 15:
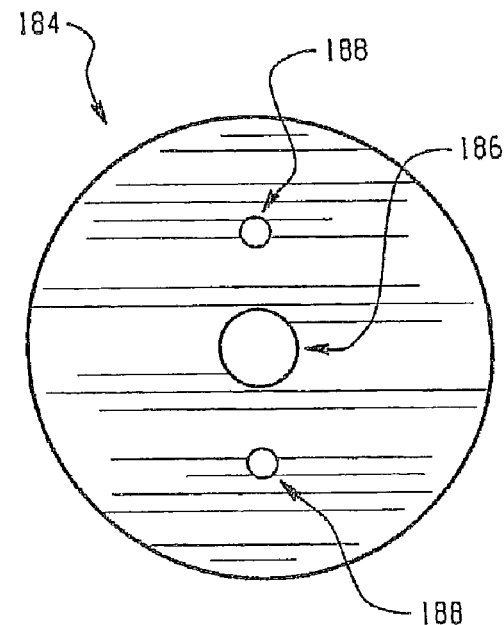
FIG. 15 illustrates a bottom plan view of the orifice plate of FIG. 14.

An alternative orifice plate 184 is illustrated in FIGS. 14 and 15. FIG. 14 illustrates the side facing the flow path surface 146, and FIG. 15 illustrates the side facing the fluid cavity 158 of the current generator body 148. The orifice plate 184 has a central hole 186 and side holes 188 disposed on either side of the central hole 186. Each of the holes has a conical or nozzle-like profile, so that the hole inlet 190 is larger in diameter than the hole outlet 192. The central hole 186 is disposed so that the inlet 190 is on the side of the orifice plate 184 facing the fluid cavity 158 (FIG. 14) of the current generator body 148, while the two side holes 188 face the opposite direction. Since the holes have a lower resistance to flow in the direction from the inlet 190 to the outlet 192 than in the opposite direction, this arrangement tends to make air going inward to the fluid cavity 158 flow through the two side holes 188, while flowing outward from the fluid cavity 158 tends to flow though the central hole 186. This increases the velocity of the air flow out of the fluid cavity 158 which increases the effectiveness of the synthetic jet actuator 140.

Figure 16:
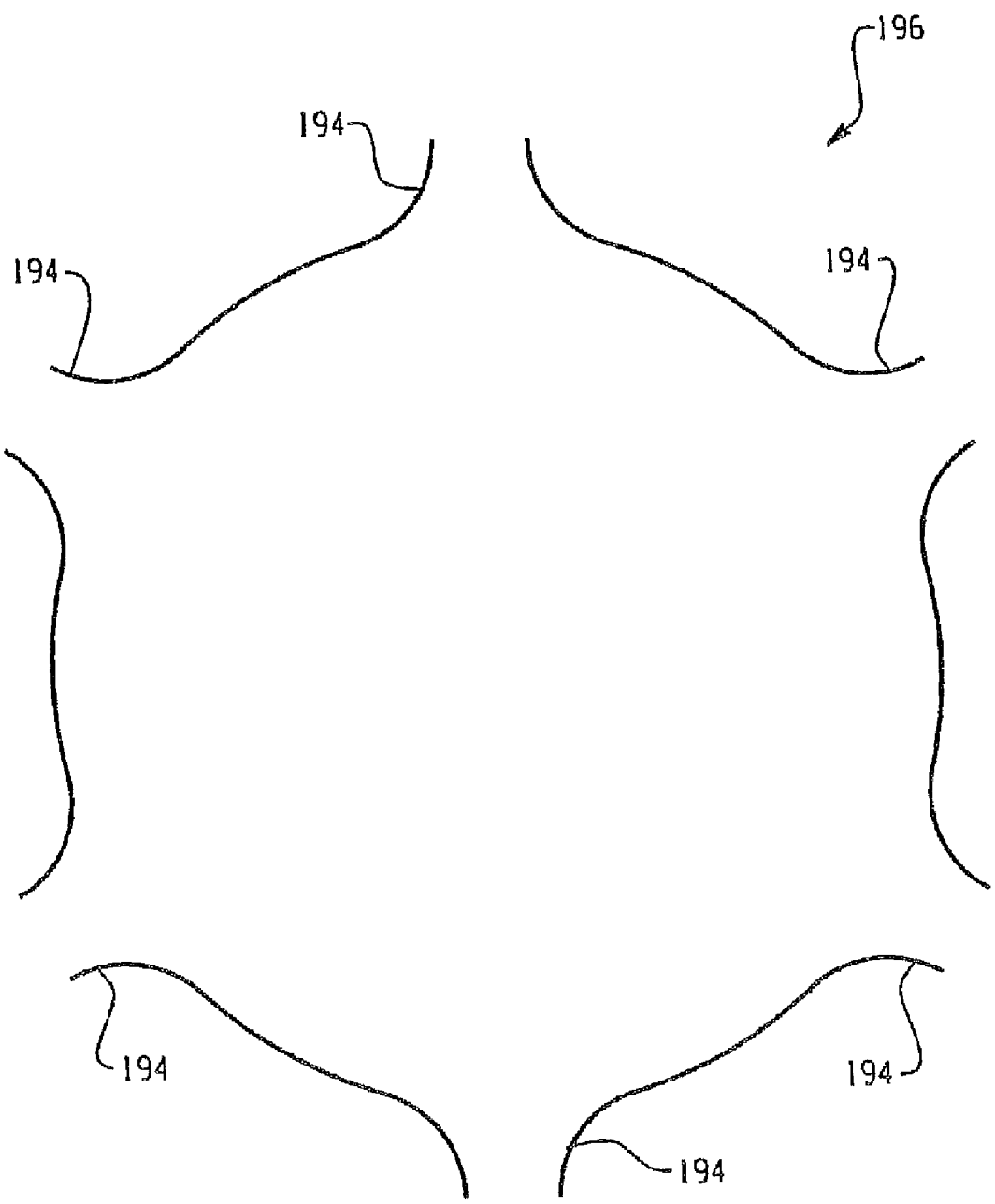
FIG. 16 illustrates a multiple outlet arrangement for a heat dissipation system.

As an alternative to the arrangement illustrated in FIG. 8, the current generator body 148 can be provided with more than one outlet. For example, with reference to FIG. 16, a plurality of discharge conduits 194 may be arranged around the periphery of a current generator body. FIG. 16 depicts how these additional discharge conduits 194 could be incorporated into a flexible hinge 196, which is seen from the side in FIG. 16. The number of discharge conduits 194 is only limited by the physical space available. Although the outlet velocity is reduced by adding additional discharge conduits 194, the outlet velocity is not reduced in proportion to the number of additional discharge conduits 194. For example, testing has shown that a current generator body 148 having 6 outlets still produces about 90% of the outlet velocity of the same current generator having a single outlet. In other words, a single current generator body 148 could be used to produce output for a number of orifices 152.

Figure 17:
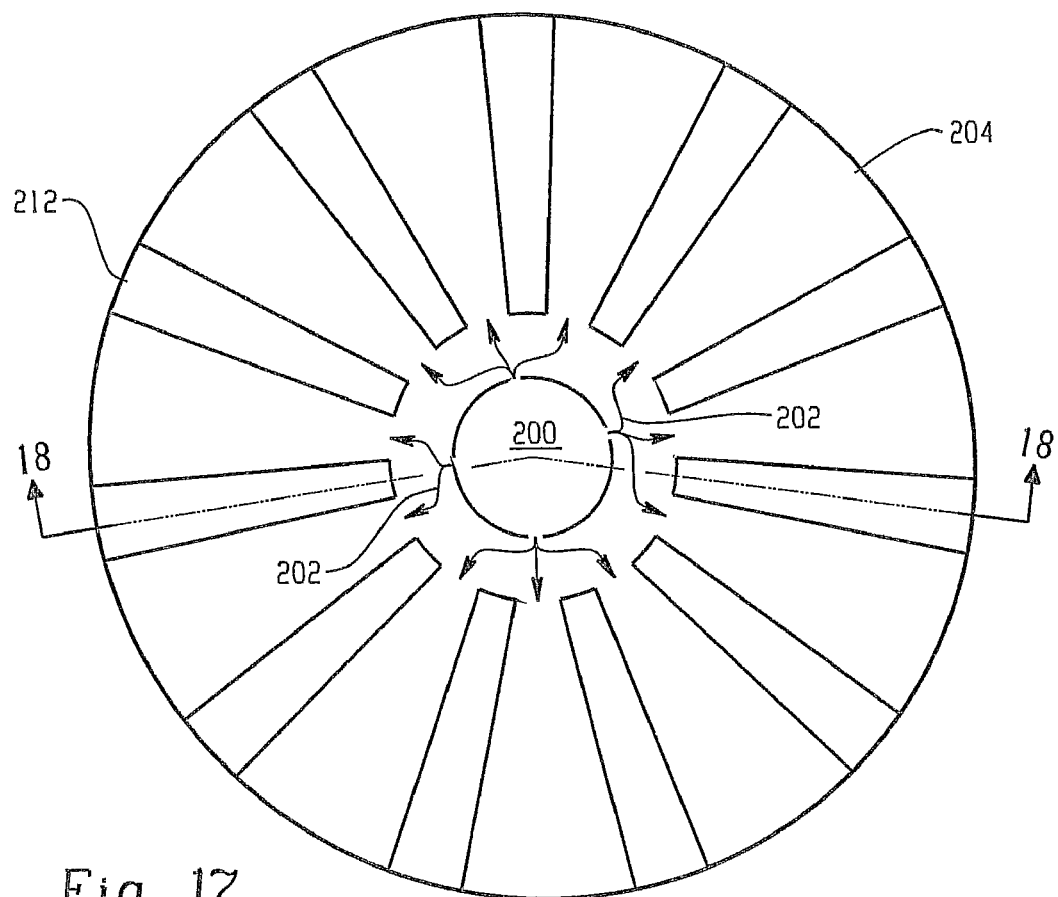
FIG. 17 illustrates a plan view of a portion of a lamp device having another alternative heat dissipation system.
Figure 18:
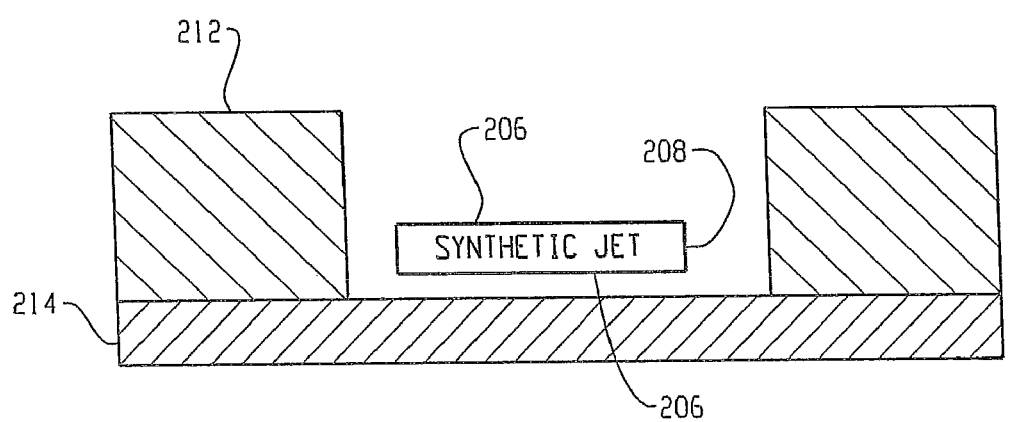
FIG. 18 illustrates a cross-section of FIG. 17 taken at line 18-18.

For example, as shown in FIG. 17, a fluid current generator 200 includes a plurality of openings 202 to cool a heat sink 204 of an LED assembly. With reference to FIG. 18, the fluid current generator 200 includes a pair of flexible side plates 206 attached to or including piezoelectric material, similar to that depicted in FIG. 8. Piezoelectric material is charged to move the flexible side plates. A flexible hinge 208 connects the pair of plates; and the flexible hinge includes the plurality of openings 202. Also, the heat sink 204 includes a plurality of fins 212 extending from a base 214 of the heat sink. The fins 212 radiate from the center of the heat sink, and the fluid current generator 200 is situated at or near the center of the heat sink. Such a configuration can be used to cool an LED array similar to array described with respect to FIGS. 1-4.

Figure 19:
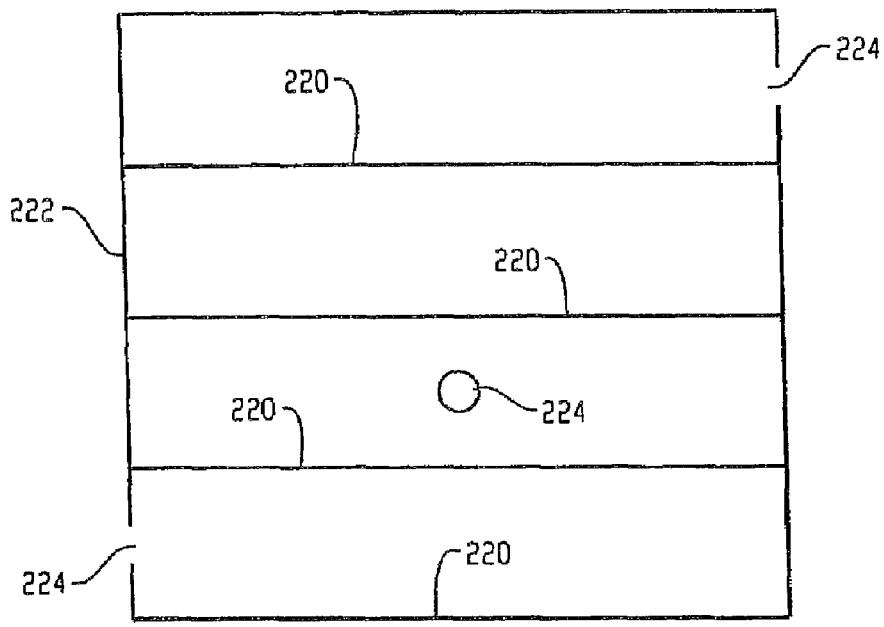
FIG. 19 illustrates a side elevation view of an alternative fluid current generator.
Figure 20:
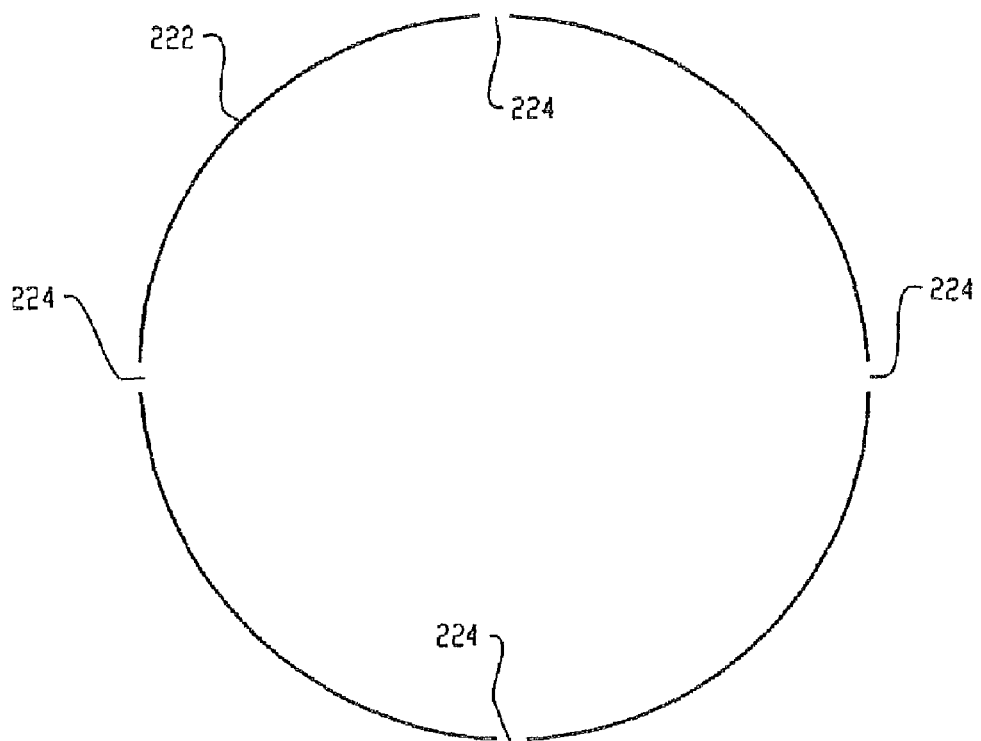
FIG. 20 illustrates a plan view of FIG. 19.

In another alternative embodiment, a plurality of synthetic jets is shown in FIGS. 19 and 20. In this embodiment, side plates 220 attach to one another by flexible hinge 222. The flexible hinge can be one contiguous piece, or it can comprise a plurality of distinct hinge pieces connecting one or two side plates together, for example. The flexible hinge can include a plurality of openings 224 that can direct current flow to different locations. For example, one opening 224 can be provided for the space between two adjacent side plates 220. Alternatively, more than one opening could be provided for such a space.

The fluid current generators described above can be used to cool portions of an LED light assembly. One fluid current generator can be used to cool one or a few LEDs. Alternatively, multiple LED systems can employ a heat sink, and the fluid current generators described above can be used to move current over the surface of the heat sink to cool the LEDs.

Figure 21:
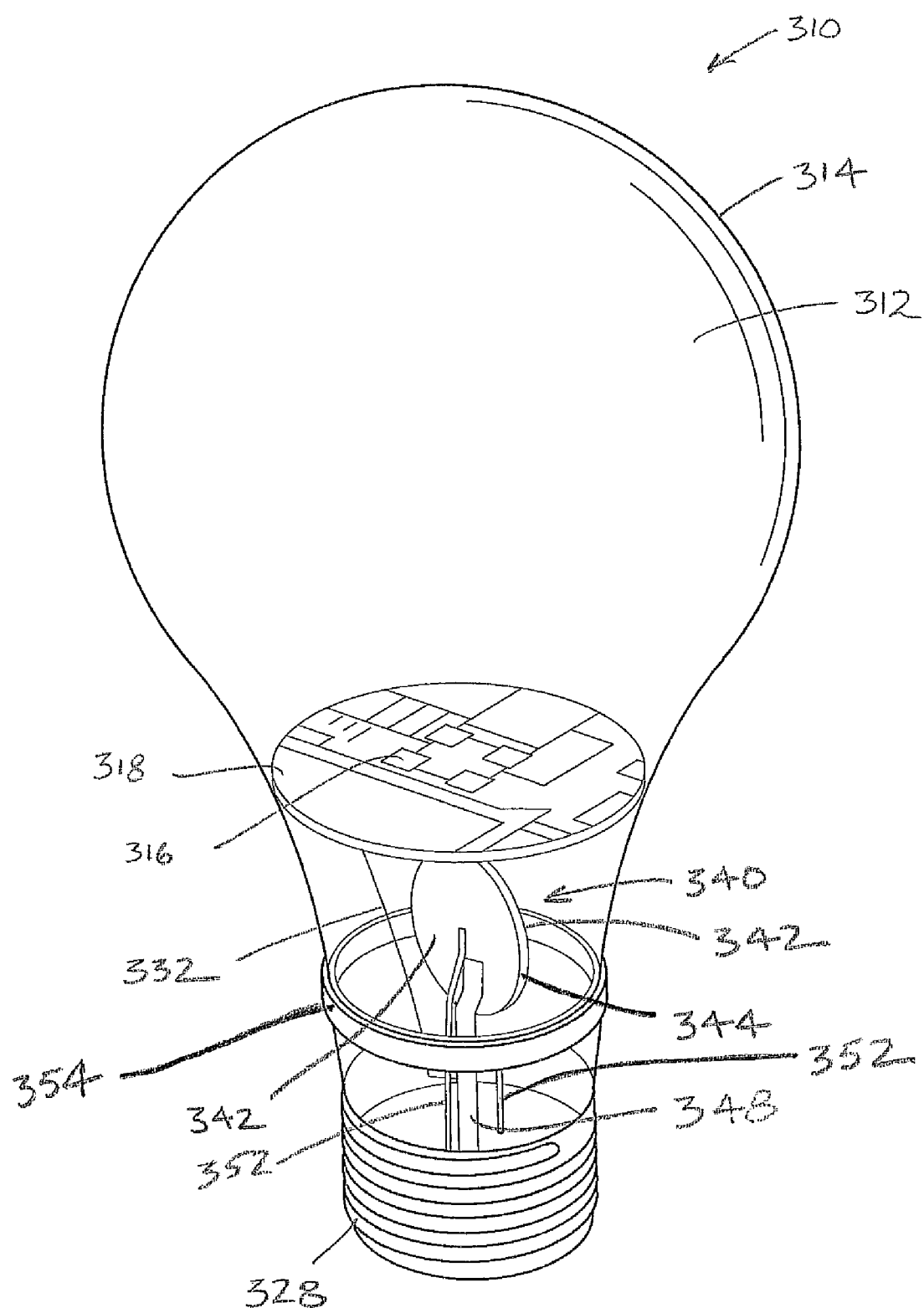
FIG. 21 is a perspective view of an example of an LED lamp that incorporates a synthetic jet to cool components of the lamp.

With reference to FIG. 21 a more specific example of an LED lamp 310 that incorporates a synthetic jet to cool portions of the lamp is shown. An example on an LED lamp that does not include a synthetic jet to cool portions of the lamp, but does include many other components of the lamp shown in FIG. 21 is disclosed in WO 2004/100213, which is incorporated by reference herein. The lamp 310 includes an enclosure, which in the embodiment depicted in FIG. 21 is a bulb 312 that is similarly shaped to a conventional bulb found in incandescent lamps. The bulb 312 is shown as transparent for clarity. The bulb 312 can be coated with phosphor 314 that is contained within a light transmissive medium, e.g. the bulb. This allows for the use of a UV/Blue LED 316 and a phosphor or blend of phosphors, for converting LED-generated ultraviolet (UV) and/or blue light into white light for general illumination purposes. It should be appreciated, however, that the invention is also suitable to the conversion of light from other light sources to light of a different wavelength. Furthermore, LED devices that are capable of generating white light can also be used which would obviate the need for the phosphor layer.

Figure 22:
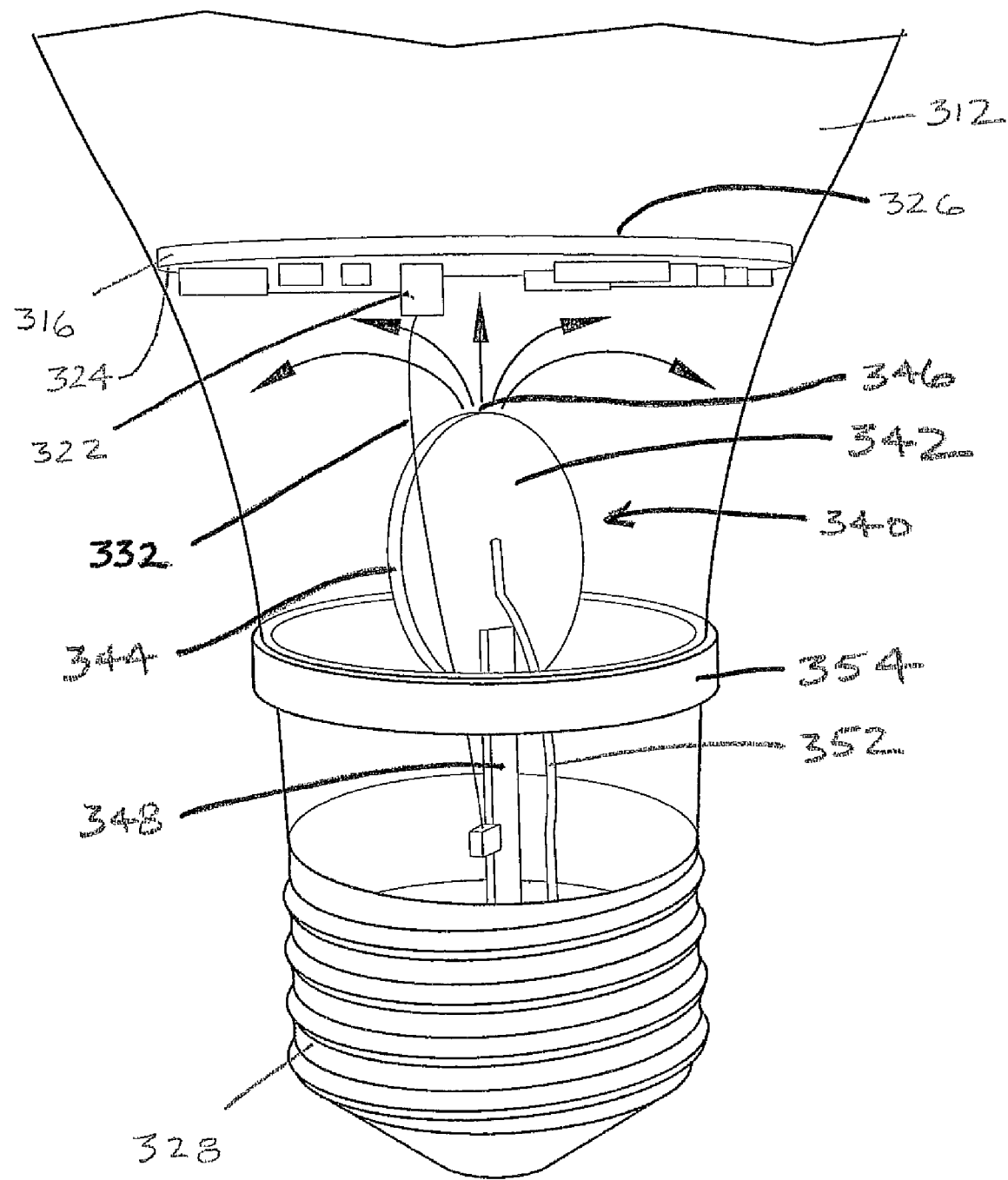
FIG. 22 is an enlarged perspective view of a lower portion of the lamp of FIG. 21.

As discussed above, LEDs 316 are used to generate light, as compared to a filament that is used in a standard incandescent lamp. The LEDs 316 mount to a printed circuit board ("PCB") 318 (or other support such as those described above). The PCB 318 is disposed in the enclosure. With reference to FIG. 22, power conditioning electronics 322 mount to a lower surface 324 of the PCB 318 and the LEDs 316 (FIG. 21) mount to the upper side 326 of the PCB. The power conditioning electronics are in electrical communication with the LEDs and are configured to convert higher voltage AC power to a lower voltage DC power for driving the LEDs 316. Alternatively, the power conditioning electronics can be configured to convert higher voltage AC power to a lower voltage AC power for driving the LEDs 316 while limiting the reverse bias on the LEDs. The power conditioning electronics 322 are also in electrical communication with an Edison base 328, which is depicted schematically by a wire 332. The Edison base 328 provides an electrical connection between the electrical components of the lamp 310 and an external power source, which is typically 120 VAC. Alternatively, the Edison base can be replaced with another electrical connector, for example a bi-pin connector, that is attached to the enclosure to provide for the electrical connection to the external power source for the lamp 310.

A synthetic jet 340 is disposed in the enclosure 312 to cool the LEDs 316 and the electronics. The synthetic jet 340 is similar to the synthetic jets that are described above. The synthetic jets 340 include side plates 342 that attach to one another by flexible hinge 344. The flexible hinge can be one contiguous piece, or it can comprise a plurality of distinct hinge pieces connecting one or two side plates together, for example. The flexible hinge 344 includes an opening 346 through which fluid is expelled and directed towards the PCB 316 to cool the LEDs and the power conditioning electronics. The synthetic jet 340 connects to a mounting bracket 348 that, in the depicted embodiment, is located aligned with a symmetrical axis of the lamp.

The synthetic jet 340 is also in electrical communication with the Edison base 328. Wires 352 provide the electrical connection between the Edison base 328 and the synthetic jet. Power conditioning electronics can be located in the circuit that connects the synthetic jet 340 to the Edison base 328 to condition the input AC power to remove voltage spikes, and the like, to provide a cleaner sinusoidal wave AC power to the synthetic jet. These power conditioning electronics can be found in a module that is surrounded by the Edison base.

To allow for the ingress of cool air and the egress of hot air, a filter 354 covers a vent in formed in the enclosure 312. The filter 354 can also be located where the Edison base 328 meets the bulb 312 and can be attached to or integrally formed with the Edison base.

Figure 23:
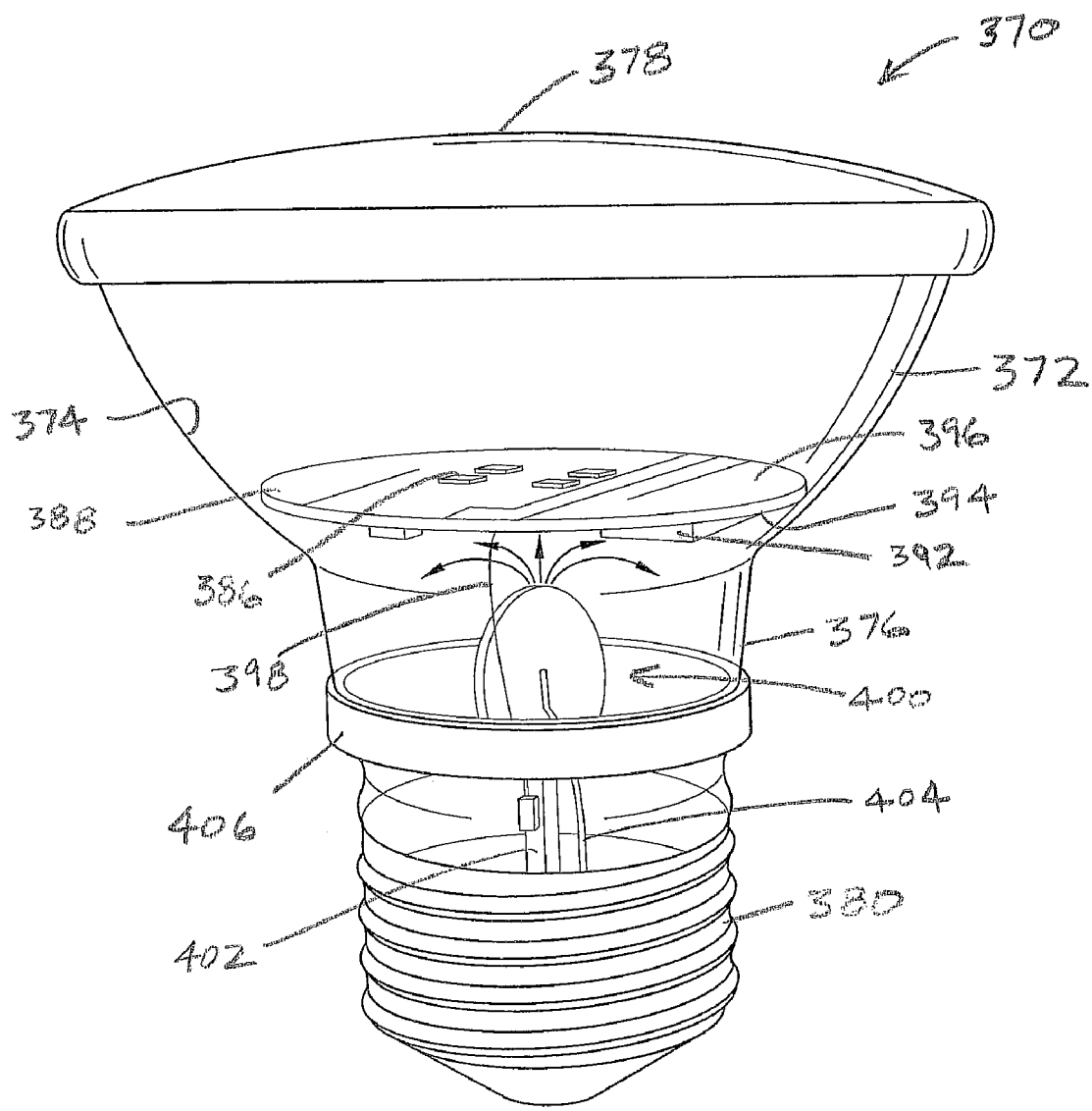
FIG. 23 is a perspective view of another example of an LED lamp that incorporates a synthetic jet to cool components of the lamp.
Figure 25:
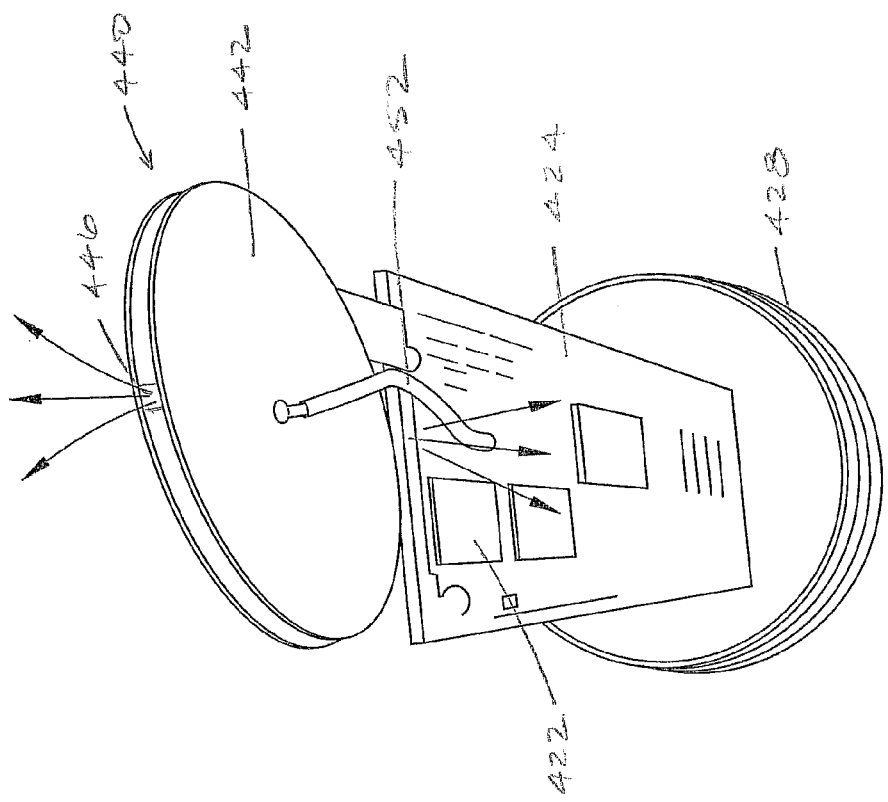
FIG. 25 is an enlarged perspective view of the synthetic jet actuator and electrical components for the lamp shown in FIG. 24.

With reference to FIG. 23 another example of an LED lamp 370 that incorporates a synthetic jet to cool portions of the lamp is shown. This lamp 370 includes a reflector housing 372 that is shaped similar to a convention PAR lamp. The reflector housing 372 is shown as translucent in FIG. 23 for clarity. The reflector housing 372 is made of glass and provides an enclosure for a light source, which will be described in more detail below. The reflector housing is coated with a reflective coating. The reflector housing includes a reflective portion 374, along at least an inner surface thereof and is preferably a highly reflective material such as an aluminum layer, although other reflective surfaces such as a dichroic material can be used without departing from the scope and intent of the present invention. The reflective portion 374 typically has a concave or parabolic shape, although it is contemplated that the reflector housing could adopt a different contour or shape such as an elliptical or other known shape or combination of shapes. The reflector housing further includes a heel portion 376 that depends axially outwardly from a central portion of the reflective portion 374 and has a substantially cylindrical configuration. The heel portion 376 attaches to a lamp base, such as an Edison base 380. A lens cover 378 encloses the reflector housing along the outer circumference of the housing. The lens cover 378 can be coated with phosphor similar to the bulb described in FIGS. 21 and 22.

LEDs 386 are used to generate light. The LEDs 386 mount to a printed circuit board ("PCB") 388 (or other support such as those described above). The PCB 388 is disposed in the reflector housing 372. Power conditioning electronics 392 mount to a lower surface 394 of the PCB 388 and the LEDs 386 mount to the upper side 396 of the PCB. The power conditioning electronics are in electrical communication with the LEDs and are configured to convert higher voltage AC power to a lower voltage DC power for driving the LEDs. Alternatively, the power conditioning electronics can be configured to convert higher voltage AC power to a lower voltage AC power for driving the LEDs while limiting the reverse bias on the LEDs. The power conditioning electronics are also in electrical communication with an Edison base 380, which is depicted schematically by a wire 398.

A synthetic jet 400 is disposed in the reflector housing 372 to cool the LEDs and the electronics. The synthetic jet 400 is similar to the synthetic jets that are described above. The synthetic jet 400 connects to a mounting bracket 402 that, in the depicted embodiment, is located aligned with a symmetrical axis of the lamp. Similar to the embodiment depicted in FIGS. 21 and 22, the synthetic jet 400 is also in electrical communication with the Edison base 380. Wires 404 provide the electrical connection between the Edison base 380 and the synthetic jet. Power conditioning electronics can be located in the circuit that connects the synthetic jet 400 to the Edison base 380 to condition the input AC power to remove voltage spikes, and the like, to provide a cleaner sinusoidal wave AC power to the synthetic jet. These power conditioning electronics can be found in a module that is surrounded by the Edison base.

To allow for the ingress of cool air and the egress of hot air, a filter 406 covers a vent in formed in the reflector housing 372. The filter 404 can also be located where the Edison base 380 meets the heel 376 and can be attached to or integrally formed with the Edison base.

Figure 24:
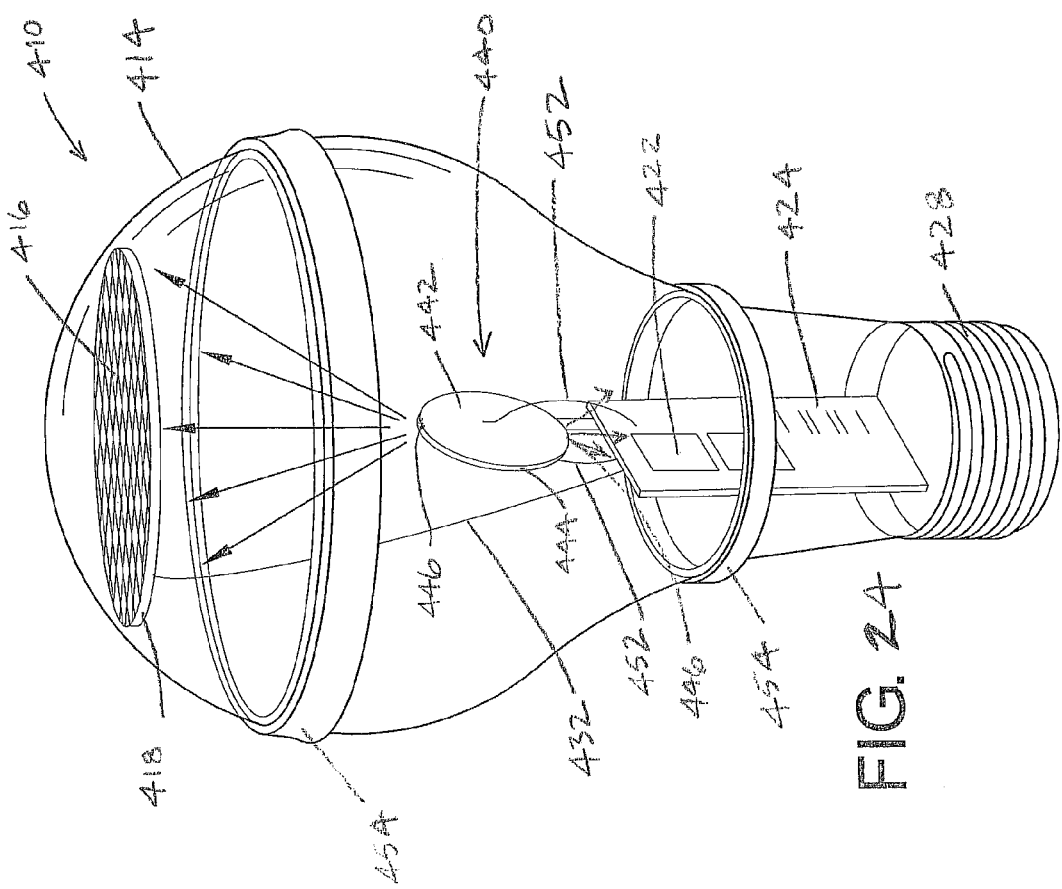
FIG. 24 is perspective view of another example of an LED lamp that incorporates a synthetic jet to cool components of the lamp.

With reference to FIG. 24 another example of an LED lamp 410 that incorporates a synthetic jet to cool portions of the lamp is shown. The lamp 410 includes an enclosure, which in the embodiment depicted in FIG. 24 is a bulb 412 that is similarly shaped to a conventional bulb found in incandescent lamps. The bulb 412 is shown as transparent for clarity. The bulb 412 is coated with phosphor 414 that is contained within a light transmissive medium, e.g. the bulb. This allows for the use of a UV/Blue LED and a phosphor or blend of phosphors, for converting LED-generated ultraviolet (UV) and/or blue light into white light for general illumination purposes. It should be appreciated, however, that the invention is also suitable to the conversion of light from other light sources to light of a different wavelength. Furthermore, LED devices that are capable of generating white (or other color) light can also be used which would obviate the need for the phosphor layer.

As discussed above, LEDs are used to generate light, as compared to a filament that is used in a standard incandescent lamp. The LEDs (not visible, but are the same as or very similar to the LEDs 316 shown in FIG. 21) mount to a printed circuit board ("PCB") 418 (or other support such as those described above) and are disposed beneath a lens 416 that mounts overtop the LEDs. The PCB 418 is disposed in the enclosure.

Power conditioning electronics 422 are provided on a second PCB 424 that is spaced from the first PCB 418. The power conditioning electronics are in electrical communication with the LEDs and are configured to convert higher voltage AC power to a lower voltage DC power for driving the LEDs. Alternatively, the power conditioning electronics can be configured to convert higher voltage AC power to a lower voltage AC power for driving the LEDs while limiting the reverse bias on the LEDs. The power conditioning electronics 422 are in electrical communication with an Edison base 428 so that they receive external AC power. The power conditioning electronics 422 are also in electrical communication with the LEDs depicted schematically by a wire 432.

A synthetic jet 440 is disposed in the enclosure 412 to cool the LEDs and the electronics. The synthetic jet 440 is similar to the synthetic jets that are described above. The synthetic jets 440 include side plates 442 that attach to one another by flexible hinge 444. The flexible hinge can be one contiguous piece, or it can comprise a plurality of distinct hinge pieces connecting one or two side plates together, for example. The flexible hinge 444 includes openings 446 through which fluid is expelled and directed towards the first PCB 418 to cool the LEDs and towards the second PCB 424 to cool the power conditioning electronics 422. The synthetic jet 440 connects to a mounting bracket 448 that, in the depicted embodiment, extends from the second PCB 424.

The synthetic jet 440 is also in electrical communication with the Edison base 428 through the power conditioning electronics 422. Wires 452 provide the electrical connection between the power conditioning electronics 424 and the synthetic jet. Power conditioning electronics 424 also condition the input AC power to remove voltage spikes, and the like, to provide a cleaner sinusoidal wave AC power to the synthetic jet.

To allow for the ingress of cool air and the egress of hot air, filters 454 cover respective vents in formed in the enclosure 412. At least one of the filters 454 can also be located where the Edison base 428 meets the bulb 412 and can be attached to or integrally formed with the Edison base.

In the example embodiments depicted in FIGS. 21-25, the synthetic jet actuator can take other configurations that those shown. For example, the synthetic jet actuator can include a flexible diaphragm mounted around its periphery to a rigid housing defining an internal chamber. The diaphragm includes an orifice. The diaphragm moves in and out of the internal chamber as it is being actuated by a piezoelectric actuator. Also, the synthetic jet actuator can take the configuration of the synthetic jet actuators described in FIGS. 8-20. Moreover, bases other than the Edison base that is disclosed can be used to electrically connect the lamp to an external source of power.

Figure 26:
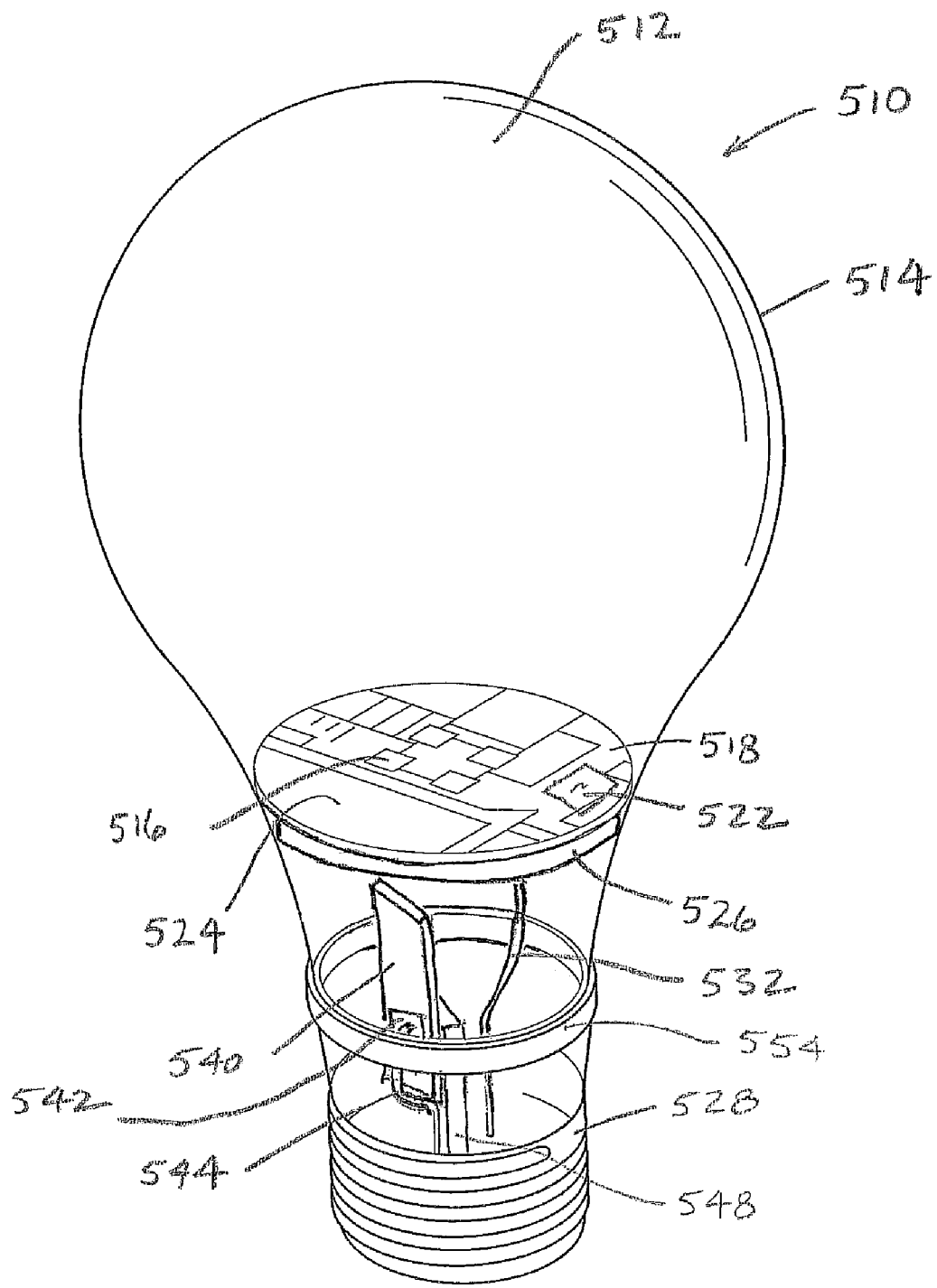
FIG. 26 is a perspective view of an example of an LED lamp that incorporates a movable blade to cool components of the lamp.

With reference to FIG. 26 another example of an LED lamp 510 that incorporates a piezofan to cool portions of the lamp is shown. A blade that is driven by electromagnetic force, similar to the embodiment shown in FIG. 2A, can also be utilized in lieu of the piezofan. The lamp 510 includes an enclosure, which in the embodiment depicted in FIG. 26 is a bulb 512 that is similarly shaped to a conventional bulb found in incandescent lamps. Alternatively, the lamp can have the configuration similar to a PAR lamp, such as that described in FIG. 23, with the remainder of the components being the same or very similar to that which will be described below. The bulb 512 is shown as transparent for clarity. The bulb 512 can be coated with phosphor 514 that is contained within a light transmissive medium, e.g. the bulb. This allows for the use of a UV/Blue LED 516 and a phosphor or blend of phosphors, for converting LED-generated ultraviolet (UV) and/or blue light into white light for general illumination purposes. It should be appreciated, however, that the invention is also suitable to the conversion of light from other light sources to light of a different wavelength. Furthermore, LED devices that are capable of generating white light can also be used which would obviate the need for the phosphor layer.

As discussed above, LEDs 516 are used to generate light, as compared to a filament that is used in a standard incandescent lamp. The LEDs 516 mount to a printed circuit board ("PCB") 518 (or other support such as those described above). The PCB 518 is disposed in the enclosure. Power conditioning electronics 522 (schematically depicted) mount to an upper surface 524 of the PCB 518 and a heat sink 526 contacts a lower surface of the PCB. The heat sink 526 is similar to those described above, and can include fins (even though none are shown). Heat from the LEDs 516 is transferred into the heat sink.

The power conditioning electronics 522 are in electrical communication with the LEDs and are configured to convert higher voltage AC power to a lower voltage DC power for driving the LEDs 516. Alternatively, the power conditioning electronics can be configured to convert higher voltage AC power to a lower voltage AC power for driving the LEDs 516 while limiting the reverse bias on the LEDs. The power conditioning electronics 522 are also in electrical communication with an Edison base 528, which is depicted schematically by a wire 532. The Edison base 528 provides an electrical connection between the electrical components of the lamp 510 and an external power source, which is typically 120 VAC. Alternatively, the Edison base can be replaced with another electrical connector, for example a bi-pin connector, that is attached to the enclosure to provide for the electrical connection to the external power source for the lamp 510. The power conditioning electronics can also be located elsewhere in the lamp 510, for example in the Edison base or on a separate PCB (for example similar to the configuration depicted in FIG. 24).

A blade 540 is disposed in the enclosure 512 to cool the LEDs 516 and the electronics by passing a current over a surface or surfaces of the heat sink 526. The blade 540 is similar to the blades that are described above. Piezoelectric material 544 attaches to the blade. A wire 542 is shown connected to the piezoelectric material 544 and the Edison base 528. This can provide AC line voltage to the piezoelectric material 542 to drive the blade back and forth. Alternatively, the piezoelectric material can be in electrical communication with the power conditioning electronics 522 or with another power conversion device (not shown) to remove voltage spikes and the like that can be found in line voltage. The blade 540 connects to a mounting bracket 548 that, in the depicted embodiment, is located aligned with a symmetrical axis of the lamp and connected to the Edison base.

To allow for the ingress of cool air and the egress of hot air, a filter 554 covers a vent or vents formed in the enclosure 512. The filter 554 can also be located where the Edison base 528 meets the bulb 512 and can be attached to or integrally formed with the Edison base.

While the embodiments have been described with reference to such terms as "upper," "lower," "above" and the like, these terms are used for better understanding of the embodiments with respect to the orientation of the figures. These terms do not limit the scope of the invention. Furthermore, certain components of the embodiments have been described with reference to their location in comparison to other components. These descriptions should not limit the invention to only those configurations described. Preferred embodiments have been described, obviously, modifications and alterations will occur to others upon a reading and understanding the preceding detailed description. It is intended that the invention be construed as including all such modifications and alterations as so far as they come within the scope of the claims, and equivalents thereof.

The invention claimed is:

1. A lamp system comprising:
   an enclosure;
   an LED disposed in the enclosure;
   a synthetic jet actuator at least partially disposed in the enclosure for generating a current of fluid to cool the LED; and
   power conditioning circuitry in electrical communication with the LED and the synthetic jet actuator, the circuitry being configured to receive source power from a source and to deliver a first power to the synthetic jet actuator and to the LED.

2. The system of claim 1, wherein the first power includes AC voltage and the second power includes DC voltage.

3. The system of claim 1, wherein at least a portion of the circuitry is located on a printed circuit board at least partially disposed in the enclosure.

4. The system of claim 1, wherein at least a portion of the circuitry is located outside of the enclosure.

5. The system of claim 1, wherein the enclosure includes a translucent bulb.

6. The system of claim 5, further comprising an Edison base connected to the bulb, the circuitry being in electrical communication with the Edison base.

7. The system of claim 1, further comprising at least one opening formed in the bulb.

8. The system of claim 7, wherein the at least one opening is covered by a filter.

9. The system of claim 1, wherein the synthetic jet actuator includes a first plate, a second plate, a flexible material connecting the first plate to the second plate and at least one opening defined by at least one of the first plate, the second plate and the flexible material.

10. The system of claim 9, wherein at least one of the first plate and the second plate includes a shim and piezoelectric material contacting the shim.

11. A lamp comprising:
an enclosure including a translucent portion;
an electrical connector attached to the enclosure, the connector being configured to electrically connect to an external power source;
an LED disposed in the enclosure and in electrical communication with the electrical connector; and
a synthetic jet actuator in electrical communication with the electrical connector and arranged in the enclosure to generate a fluid current to cool the LED.

12. The lamp of claim 11, wherein the enclosure includes a vent through which fluid is able to flow.

13. The lamp of claim 12, wherein the enclosure includes at least two vents.

14. The lamp of claim 13, wherein at least one of the vents is covered by a filter.

15. The lamp of claim 11, wherein the electrical connector includes a vent through which fluid is able to flow.

16. The lamp of claim 11, wherein at least a portion of the enclosure is coated with a phosphor material.

17. The lamp of claim 11, wherein the electrical connector includes at least one of an Edison base and a bi-pin connector.

18. The lamp of claim 11, further comprising power conditioning electronics in electrical communication with the synthetic jet actuator, the LED and the electrical connector, the power conditioning electronics being configured to convert a higher voltage power from the electrical connector into a lower voltage power that is delivered to the LED.

19. The lamp of claim 18, wherein at least a portion of the power conditioning electronics reside on a printed circuit board and the LED mounts to the printed circuit board.

20. The lamp of claim 18, wherein at least a portion of the power conditioning electronics reside on a first printed circuit board and the LED mounts to a second printed circuit board, the first printed circuit board being in electrical communication with the second printed circuit board.

21. The lamp of claim 20, wherein the synthetic jet includes at least two openings, a first opening being for directing a fluid stream generally towards the first circuit board and a second opening being for directing a fluid stream generally towards the second circuit board.

22. The lamp of claim 11, wherein the enclosure includes a reflector and a translucent cover.

23. The lamp of claim 11, wherein the enclosure includes a translucent bulb.

24. An LED light assembly comprising:
an LED;
a synthetic jet actuator disposed with respect to the LED for creating a fluid current to cool the LED, wherein the synthetic jet actuator includes a first plate, a second plate, a piezoelectric material contacting at least one of the first plate and the second plate and a flexible hinge connecting the first plate and the second plate.

25. The assembly of claim 24, further comprising a housing including a translucent portion, the LED and the synthetic jet actuator being disposed in the housing.

26. The assembly of claim 25, wherein the housing comprises a translucent bulb.

27. The assembly of claim 25, wherein the housing includes a reflector.

28. The assembly of claim 25, wherein the translucent portion is coated with a phosphor material.

29. The assembly of claim 24, further comprising an Edison base in electrical communication with the LED and the synthetic jet actuator.

30. The assembly of claim 29, further comprising circuitry in electrical communication with the Edison base for delivering AC power to the synthetic jet and DC power to the LED.

31. The assembly of claim 30, wherein at least a portion of the circuitry is disposed on a printed circuit board.

32. The assembly of claim 31, wherein the LED mounts to the printed circuit board.

33. The assembly of claim 31, wherein the printed circuit board is a first printed circuit board and the LED mounts to a second printed circuit board that is in electrical communication with the first printed circuit board.

34. The lamp of claim 33, wherein the synthetic jet includes at least two openings, a first opening being for directing a fluid stream generally towards the first circuit board and a second opening being for directing a fluid stream generally towards the second circuit board.

* * * * *